United States Patent
Terada et al.

(10) Patent No.: US 10,031,865 B2
(45) Date of Patent: Jul. 24, 2018

(54) MEMORY SYSTEM, STORAGE DEVICE, AND METHOD FOR CONTROLLING MEMORY SYSTEM

(71) Applicant: SONY CORPORATION, Tokyo (JP)

(72) Inventors: Haruhiko Terada, Kanagawa (JP); Lui Sakai, Kanagawa (JP); Hideaki Okubo, Saitama (JP); Keiichi Tsutsui, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/527,374

(22) PCT Filed: Oct. 8, 2015

(86) PCT No.: PCT/JP2015/078610
§ 371 (c)(1),
(2) Date: May 17, 2017

(87) PCT Pub. No.: WO2016/084497
PCT Pub. Date: Jun. 2, 2016

(65) Prior Publication Data
US 2017/0329724 A1 Nov. 16, 2017

(30) Foreign Application Priority Data
Nov. 26, 2014 (JP) .................... 2014-239060

(51) Int. Cl.
*G11C 7/00* (2006.01)
*G06F 12/16* (2006.01)
(Continued)

(52) U.S. Cl.
CPC .............. *G06F 12/16* (2013.01); *G06F 11/22* (2013.01); *G06F 11/1441* (2013.01)

(58) Field of Classification Search
CPC ............ G11C 11/406; G11C 11/40615; G11C 2211/4061; G11C 11/4068; G11C 2211/4067
(Continued)

(56) References Cited

U.S. PATENT DOCUMENTS

2012/0163097 A1* 6/2012 Ishikawa ............ G11C 16/3431
365/185.25

FOREIGN PATENT DOCUMENTS

JP 06-110793 A 4/1994
JP 2007-128577 A 5/2007
(Continued)

*Primary Examiner* — Son Dinh
(74) *Attorney, Agent, or Firm* — Chip Law Group

(57) ABSTRACT

To suppress the degradation of memory cells in a non-volatile memory. A read processing unit performs a read process for reading read data from each of a plurality of memory cells on the basis of a first threshold. An error detection unit detects presence or absence of an error in the read data and specifies memory cells in which the error is present among the plurality of memory cells. A re-read processing unit performs a re-read process for reading data, as re-read data, from the specified memory cells on the basis of a second threshold different from the first threshold. A refresh processing unit rewrites, for a memory cell of which the re-read data has a different value from the read data among the specified memory cells, data with the re-read data as a refresh process.

11 Claims, 26 Drawing Sheets

(51) Int. Cl.
*G06F 11/22* (2006.01)
*G06F 11/14* (2006.01)

(58) Field of Classification Search
USPC .................................................. 365/222, 201
See application file for complete search history.

(56) References Cited

FOREIGN PATENT DOCUMENTS

| | | |
|---|---|---|
| JP | 2012-256392 A | 12/2012 |
| JP | 2013-125527 A | 6/2013 |
| WO | 2013/105414 A1 | 7/2013 |

\* cited by examiner

FIG. 6

| REQUEST NAME | DATA INPUT TO NON-VOLATILE MEMORY | DATA OUTPUT FROM NON-VOLATILE MEMORY | OPERATION OF NON-VOLATILE MEMORY |
|---|---|---|---|
| WRITE REQUEST | YES (WRITE DATA) | NO | DATA IS WRITTEN BY SET (0→1) AND RESET (1→0). |
| READ REQUEST | NO | YES (READ DATA) | DATA IS READ ON BASIS OF Vref1 ($\propto$ Rref1). |
| REFRESH REQUEST | YES (BIT SELECT SIGNAL) | NO | DATA IS READ ON BASIS OF Vref2 ($\propto$ Rref2) AND BIT WHOSE READ VALUE IS "1" IS SET (0→1). |

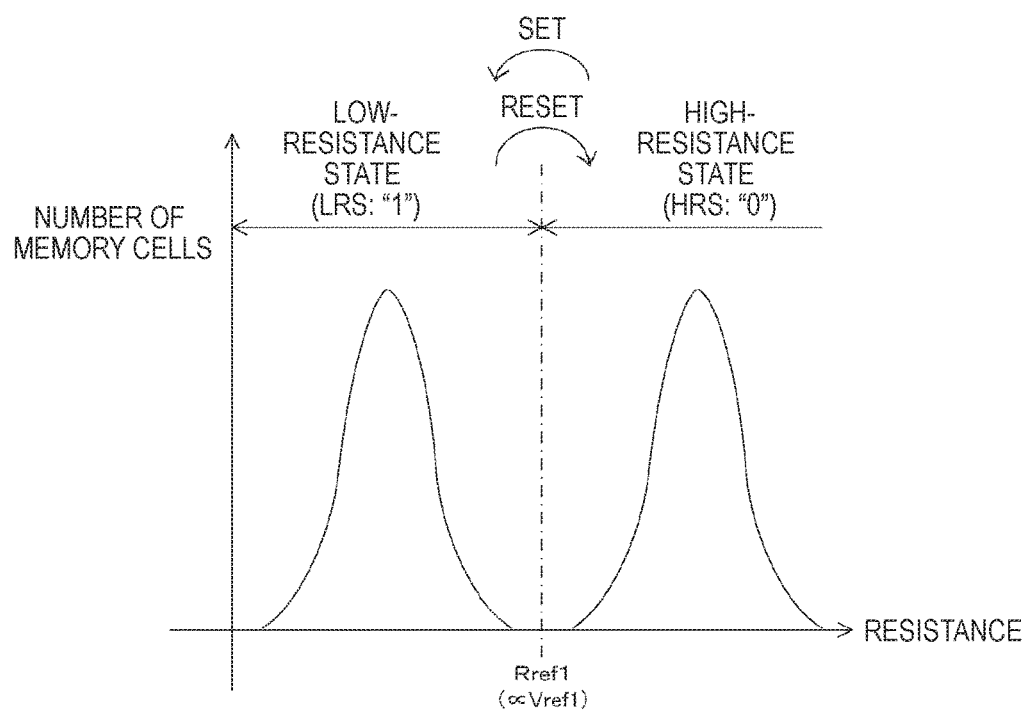

READ DATA (THRESHOLD Rref1)

| 1 | 1 | 1 | 0 | 0 | 0 | 0 | 0 | ... |

FIG. 10a

DECODED DATA

| 1 | 1 | 1 | 0 | 0 | 0 | 1 | 1 | ... |

ERROR DUE TO RD OR RTN

FIG. 10b

BIT SELECT SIGNAL

| 0 | 0 | 0 | 0 | 0 | 0 | 1 | 1 | ... |

FIG. 10c

RE-READ DATA (THRESHOLD Rref2)

| – | – | – | – | – | – | 0 | 1 | ... |

ERROR DUE TO RTN | ERROR DUE TO RD

FIG. 10d

CORRECTED BIT SELECT SIGNAL

| 0 | 0 | 0 | 0 | 0 | 0 | 0 | 1 | ... |

BIT TO BE REFRESHED THROUGH SETTING

FIG. 10e

MEMORY SYSTEM, STORAGE DEVICE, AND METHOD FOR CONTROLLING MEMORY SYSTEM

CROSS REFERENCE TO RELATED APPLICATIONS

This application is a U.S. National Phase of International Patent Application No. PCT/JP2015/078610 filed on Oct. 8, 2015, which claims priority benefit of Japanese Patent Application No. JP 2014-239060 filed in the Japan Patent Office on Nov. 26, 2014. Each of the above-referenced applications is hereby incorporated herein by reference in its entirety.

TECHNICAL FIELD

The present technology relates to a memory system, a storage device, and a method for controlling the memory system. Specifically, the present technology relates to a memory system, a storage device, and a method for controlling the memory system wherein errors of read data are detected.

BACKGROUND ART

Non-volatile memories (NVMs) have been used as auxiliary storage devices or storages in recent information processing systems. Non-volatile memories are broadly divided into flash memories for data access in units of large data sizes and non-volatile random access memories (Non-volatile RAMs) to which high-speed random access is possible in units of smaller data sizes. Here, NAND flash memories are exemplified as a representative example of flash memories. On the other hand, resistive RAMs (Re-RAMs), phase-change RAMs (PCRAMs), magnetoresistive RAMs (MRAMs), and the like are exemplified as examples of non-volatile random access flash memories.

It is known that errors occur in data written to such a non-volatile memory due to various causes such as fluctuations of current in memory cells or changes in the characteristics of memory cells due to repeated access. The former phenomenon is called random telegraph noise (RTN) and the latter is called read disturb (RD). An error due to RTN is called an "RTN error" and an error due to RD is called an "RD error". A memory controller which detects presence or absence of such errors and corrects the errors using an error detection and correction code (ECC) has been suggested (for example, see Patent Literature 1). A memory system which performs, as a refresh process, a process of rewriting data to a memory cell in which an error has occurred has also been suggested (for example, see Patent Literature 2). Through this refresh process, it is possible to recover from errors in memory cells.

CITATION LIST

Patent Literature

Patent Literature 1: JP 2013-125527A
Patent Literature 2: JP H6-110793A

DISCLOSURE OF INVENTION

Technical Problem

Although the conventional memory controller described above detects errors, it does not discriminate between error types such as an RTN error and an RD error. Therefore, in the conventional system, a memory cell is refreshed each time an error has occurred, regardless of the type of the error. However, it may not be necessary to refresh the memory cell, depending on the type of the error. For example, when an RTN error has occurred, there is little need to refresh a memory cell in which the RTN error has occurred since the RTN error is a primary state change such that the memory cell naturally recovers from the error. Performing a refresh in this case may cause the degradation of a memory cell to progress due to unnecessary rewriting.

The present technology has been made in view of the above circumstances, and it is an object of the present technology to suppress the degradation of memory cells in a non-volatile memory.

Solution to Problem

The present technology is devised to solve the above-described problem, and a first aspect thereof is a memory system and a method for controlling the memory system, the memory system including: a read processing unit configured to perform a read process for reading read data from each of a plurality of memory cells on the basis of a first threshold; an error detection unit configured to detect presence or absence of an error in the read data and to specify memory cells in which the error is present among the plurality of memory cells; a re-read processing unit configured to perform a re-read process for reading data, as re-read data, from the specified memory cells on the basis of a second threshold different from the first threshold; and a refresh processing unit configured to rewrite, for a memory cell of which the re-read data has a different value from the read data among the specified memory cells, data with the re-read data as a refresh process. This has such an effect that the refresh process is performed for a memory cell whose re-read data has a different value from the read data.

Further, according to the first aspect, the memory system may further include: a refresh control unit configured to allow the re-read unit to perform the re-read process for a memory cell, in which the error having a predetermined pattern has occurred, among the specified memory cells. This has such an effect that the re-read process is performed for a memory cell in which an error having the predetermined pattern has occurred.

Further, according to the first aspect, the memory system may further include: an address holding unit configured to hold an address allocated to the memory cells in which the error is present. When a predetermined condition has been satisfied, the refresh control unit may read the held address, designate the address, and allow the read processing unit to perform the read process. This has such an effect that the read process is performed for the held addresses.

Further, according to the first aspect, the predetermined condition may be that the number of the held addresses exceed a predetermined number. This has such an effect that the read process is performed when the number of held addresses exceeds the predetermined number.

Further, according to the first aspect, the predetermined condition may be that the refresh control unit have received a refresh command instructing that the refresh process be performed. This has such an effect that the read process is performed when the refresh command has been received.

Further, according to the first aspect, the plurality of memory cells may be divided into a plurality of sections, one of the plurality of addresses being allocated to each of the plurality of sections. When a refresh mode for performing the refresh process has been set, the refresh control unit may sequentially designate each of the plurality of addresses and allow the read processing unit to perform the read process. This has such an effect that, when the refresh mode has been set, each of the plurality of addresses is designated and the read process is performed.

Further, according to the first aspect, when the number of the errors having the predetermined pattern exceeds an allowable value, the refresh control unit may allow the re-read unit to perform the re-read process for a memory cell, in which the error having the predetermined pattern has occurred, among the specified memory cells. This has such an effect that the re-read process is performed when the number of errors having the predetermined pattern exceeds the allowable value.

Further, according to the first aspect, each of the plurality of memory cells may hold data including a plurality of bits. Each of the first and second thresholds may include a plurality of thresholds. This has such an effect that data including a plurality of bits is held in each of the memory cells.

Further, according to the first aspect, a characteristic value of the memory cells may change in a specific direction each time data is read. The second threshold may be a value obtained by changing the first threshold in the specific direction. This has such an effect that a value obtained by changing the first threshold in the specific direction is set to the second threshold.

Further, a second aspect of the present technology is a storage device including: a read processing unit configured to perform a read process for reading read data from each of the plurality of memory cells on the basis of a first threshold; a re-read processing unit configured to perform a re-read process for reading data, as re-read data, from each of memory cells having an error in the read data on the basis of a second threshold different from the first threshold; and a refresh processing unit configured to rewrite, for a memory cell of which the re-read data has a different value from the read data among the memory cells which have an error in the read data, data with the re-read data as a refresh process. This has such an effect that the read process is performed for a memory cell corresponding to a held address when a predetermined condition has been satisfied.

Advantageous Effects of Invention

According to the present technology, it is possible to achieve such an excellent effect that it is possible to suppress degradation of memory cells of a non-volatile memory. Note that effects described herein are not necessarily limitative, and any effect described in the present disclosure may be admitted.

BRIEF DESCRIPTION OF DRAWINGS

FIG. 6 is a table illustrating an example of an operation of the non-volatile memory for each request according to the first embodiment.

FIG. 7 is a view illustrating an example of a resistance distribution of memory cells before the occurrence of RD according to the first embodiment.

FIGS. 10a, 10b, 10c, 10d and 10e are views illustrating an example of read data and a bit select signal according to the first embodiment.

MODE(S) FOR CARRYING OUT THE INVENTION

Modes for carrying out the present technology (hereinafter referred to as embodiments) are described below. The description will be given in the following order.

1. First embodiment (an example in which a threshold is changed to perform re-reading and a refresh is then performed)
2. Second embodiment (an example in which a threshold is changed to perform re-reading from a held address and a refresh is then performed)
3. Third embodiment (an example in which, in a refresh mode, a threshold is changed to perform re-reading and a refresh is then performed)
4. Fourth embodiment (an example in which, when the number of errors having a predetermined pattern is large, a threshold is changed to perform re-reading and a refresh is then performed)
5. Fifth Embodiment (an example in which, in multivalued memory cells, a threshold is changed to perform re-reading and a refresh is then performed)

<1. First Embodiment>

[Example of Configuration of Memory System]

Figure 1:
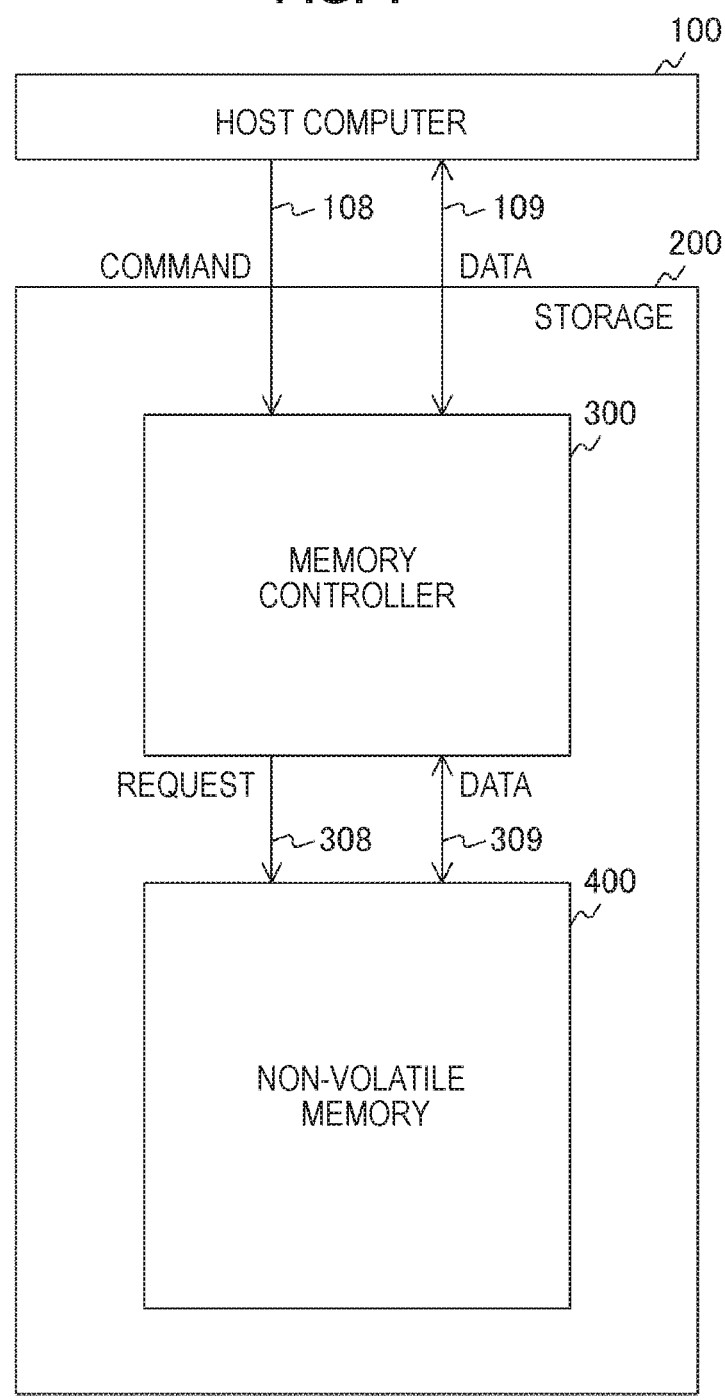
FIG. 1 is an overall diagram illustrating an example of a configuration of a memory system according to a first embodiment.

FIG. 1 is a block diagram illustrating an example of a configuration of a memory system according to a first embodiment. The memory system includes a host computer 100 and a storage 200.

The host computer 100 controls an overall memory system. Specifically, the host computer 100 generates commands and data and supplies them to the storage 200 via signal lines 108 and 109. In addition, the host computer 100 receives read data from the storage 200 via the signal line 109. Here, the commands are for controlling the storage 200 and include, for example, a write command instructing writing of data and a read command instructing reading of data.

The storage 200 includes a memory controller 300 and a non-volatile memory 400. The memory controller 300 controls the non-volatile memory 400. When a write command and data are received from the host computer 100, the memory controller 300 generates an error detection and correction code (ECC) from the data. Specifically, the memory controller 300 converts (i.e., encodes) the data into a codeword including the data and parity. The memory controller 300 accesses the non-volatile memory 400 and writes the encoded data to the non-volatile memory 400 via the signal lines 308 and 309.

When a read command has been received from the host computer 100, the memory controller 300 accesses the non-volatile memory 400 via the signal line 308 and reads the encoded data from the non-volatile memory 400 via the signal line 309. The memory controller 300 also converts (i.e., decodes) the encoded data into the original data before encoding. In addition, the memory controller 300 performs error detection and correction on data on the basis of the ECC. The memory controller 300 provides the corrected data to the host computer 100.

The non-volatile memory 400 stores data according to control of the memory controller 300. For example, a ReRAM is used as the non-volatile memory 400. The non-volatile memory 400 includes a plurality of memory cells, and the memory cells are divided into a plurality of blocks. Here, the blocks are the units of access to the non-volatile memory 400 and are also called "words". A physical address is assigned to each of the blocks. Instead of the ReRAM, a NAND or NOR type flash memory, a PCPRM, an MRAM, a spin transfer torque RAM (STT-RAM), or the like may be used as the non-volatile memory 400. The non-volatile memory 400 is an example of the storage device described in the claims.

[Example of Configuration of Memory Controller]

Figure 2:
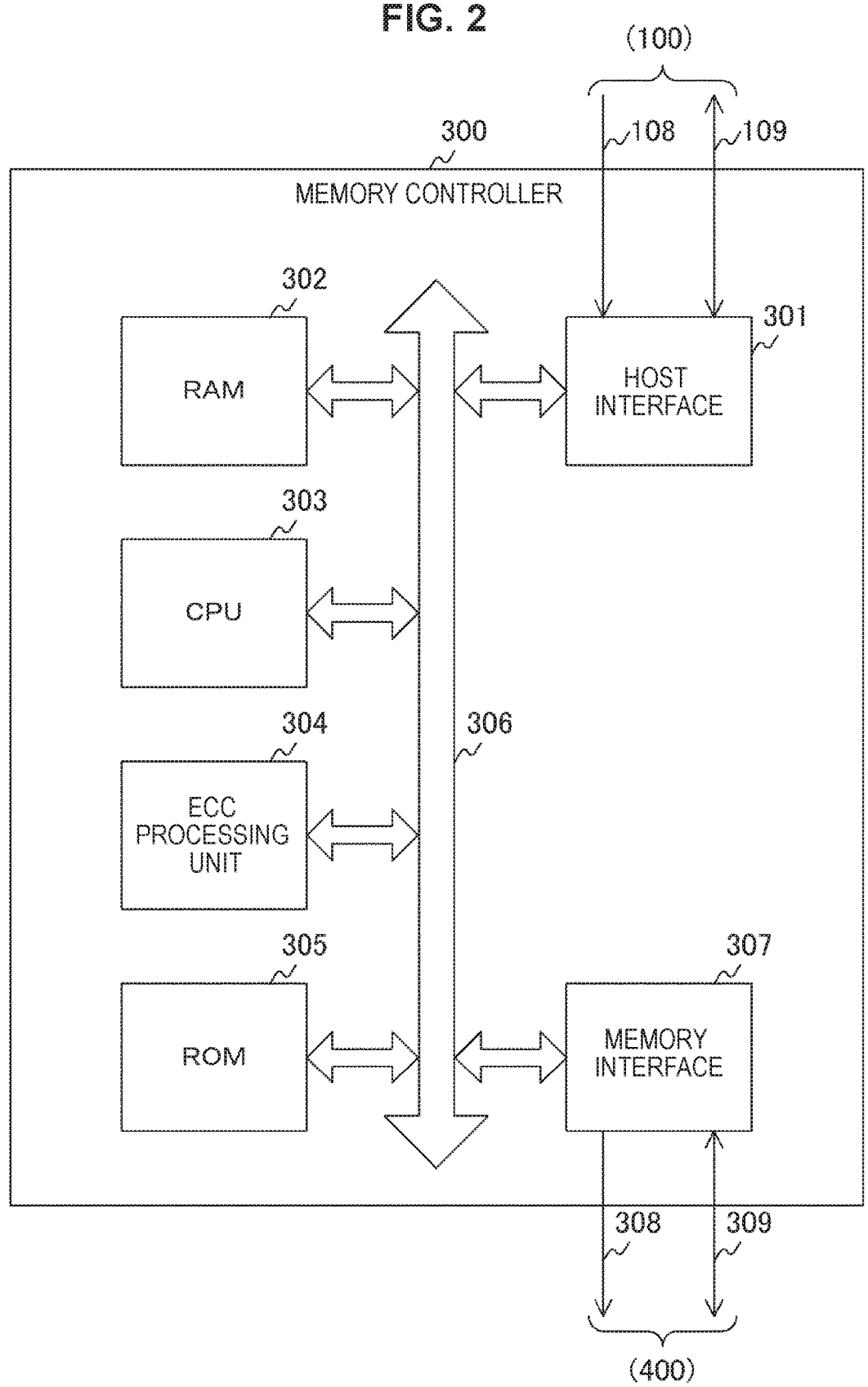
FIG. 2 is a block diagram illustrating an example of a configuration of a memory controller according to the first embodiment.

FIG. 2 is a block diagram illustrating an example of a configuration of the memory controller 300 according to the first embodiment. The memory controller 300 includes a random access memory (RAM) 302, a central processing unit (CPU) 303, an ECC processing unit 304, and a read only memory (ROM) 305. In addition, the memory controller 300 includes a host interface 301, a bus 306, and a memory interface 307.

The RAM 302 temporarily holds data necessary for processes executed by the CPU 303. The CPU 303 entirely controls the memory controller 300. The ROM 305 stores programs executed by the CPU 303 and the like. The host interface 301 is for exchanging data with the host computer 100. The bus 306 is a shared path for exchanging data between the RAM 302, the CPU 303, the ECC processing unit 304, the ROM 305, the host interface 301, and the memory interface 307. The memory interface 307 is for exchanging data with the non-volatile memory 400.

The ECC processing unit 304 is configured to encode encoding target data and to decode encoded data. In this data encoding, the ECC processing unit 304 adds parity to encoding target data to encode the data in predetermined units. The ECC processing unit 304 then provides the encoded data as write data to the non-volatile memory 400 via the bus 306.

The ECC processing unit 304 also decodes the encoded read data into the original data. In this decoding, the ECC processing unit 304 detects and corrects an error in the read data using parity. The ECC processing unit 304 provides the decoded original data to the host computer 100 via the bus 306.

Figure 3:
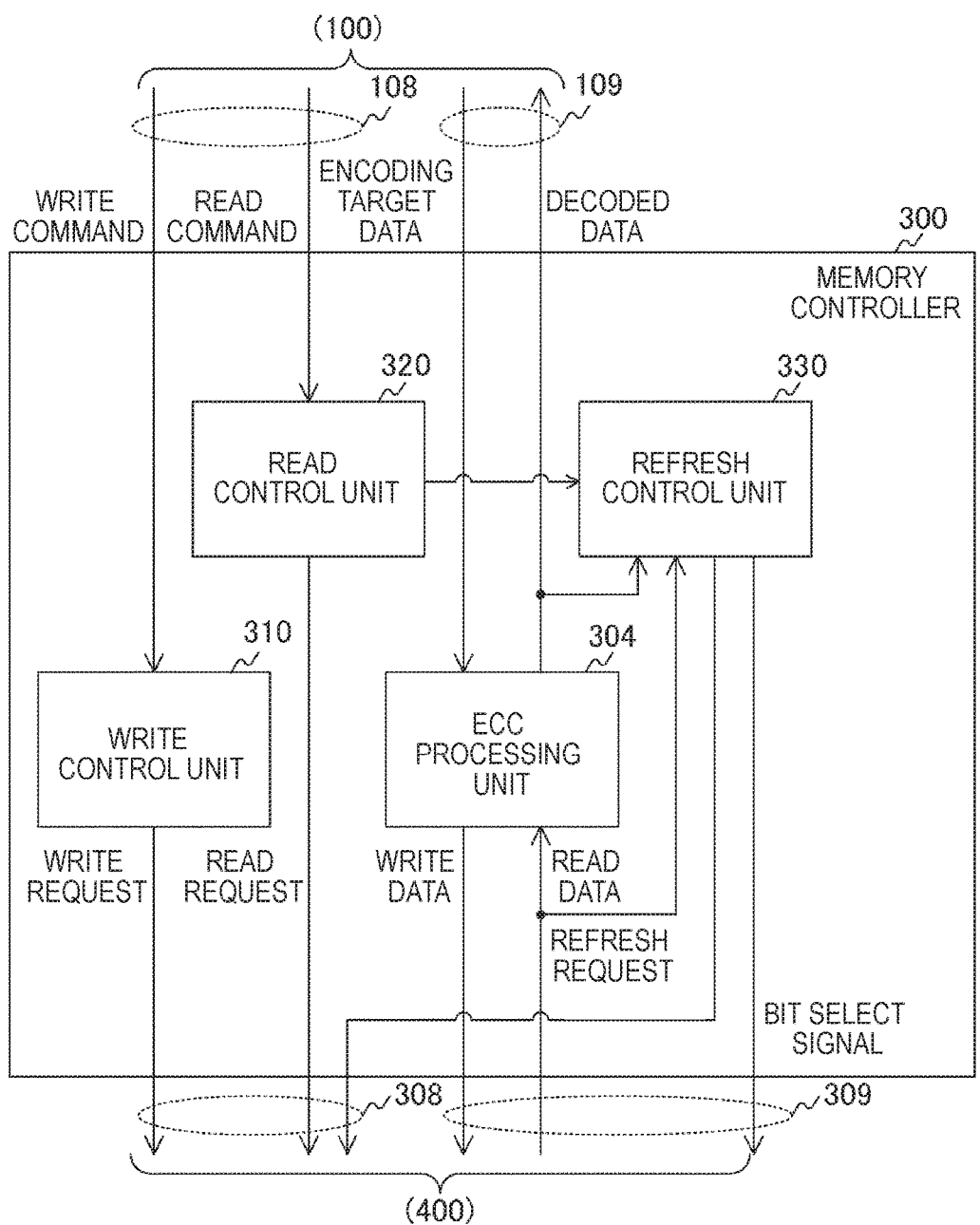
FIG. 3 is a block diagram illustrating an example of a functional configuration of the memory controller according to the first embodiment.

FIG. 3 is a block diagram illustrating an example of a functional configuration of the memory controller 300 according to the first embodiment. This memory controller 300 includes a write control unit 310, a read control unit 320, an ECC processing unit 304, and a refresh control unit 330. The write control unit 310 of FIG. 3 is realized by the RAM 302, the CPU 303, the ROM 305, the host interface 301, the bus 306, the memory interface 307 or the like of FIG. 2. The same applies to the read control unit 320 and the refresh control unit 330.

The write control unit 310 is configured to allow write data to be written to the non-volatile memory 400 in accordance with a write command. This write control unit 310 converts a logical address designated by the write command into a physical address.

Here, the logical address is an address allocated to each area of access units that are set when the host computer 100 accesses the storage 200 at an address space defined by the host computer 100. The physical address is an address assigned to each of the access units of the non-volatile memory 400 as described above.

The write control unit 310 divides the write command when the host computer 100 and the non-volatile memory 400 have different access units. The write control unit 310 performs logical to physical address conversion and provides each write command, which is divided as needed, as a write request to the non-volatile memory.

The read control unit 320 is configured to allow read data to be read from the non-volatile memory 400 in accordance with a read command. This read control unit 320 performs logical to physical conversion of the address of the read command and provides each read command, which is divided as needed, as a read request to the non-volatile memory. The read control unit 320 also provides the physical address acquired through the conversion to the refresh control unit 330.

When data has been received as an encoding target from the host computer 100, the ECC processing unit 304 encodes the encoding target data into a codeword. In this encoding, the encoding target data is encoded into, for example, a binary BCH code. The ECC processing unit 304 provides the codeword as write data to the non-volatile memory 400.

Although the ECC processing unit 304 encodes the encoding target data into a binary BCH code, the ECC processing unit 304 may encode the encoding target data into a code other than the BCH code provided the code has an error correction capability. The ECC processing unit 304 may encode the encoding target data into, for example, a Reed-Solomon (RS) code or a convolutional code. The ECC processing unit 304 may also encode the encoding target data into a higher-than-binary code.

The ECC processing unit 304 decodes a received word corresponding to a codeword when the word has been received as read data from the non-volatile memory 400. The ECC processing unit 304 provides data acquired through the decoding, as decoded data, to the host computer 100 and the refresh control unit 330. Here, parity is removed from the decoded data to be provided to the host computer 100. The ECC processing unit 304 is an example of the error detection unit described in the claims.

The refresh control unit 330 is configured to allow data to be rewritten to the non-volatile memory 400 at a memory cell where an error has occurred. The refresh control unit 330 receives read data that has not been decoded from the non-volatile memory 400 and acquires decoded data from the ECC processing unit 304. The refresh control unit 330 compares the read data and the decoded data to obtain the number of corrected errors (the number of corrections) and issues a refresh request when the number of errors is equal to or greater than a predetermined allowable value N. This refresh request is a request to designate a physical address at which the read data has been read and to request that data rewriting be performed.

The refresh control unit 330 specifies memory cells in which an error having a predetermined pattern has occurred and generates a bit select signal selecting the memory cells as rewriting targets. For example, a bit select signal having a value of "0x11" ("b00010001" in binary) is generated when the 4th and 8th from the beginning of 8 memory cells corresponding to a word are specified as rewriting targets.

Here, let us assume that the memory cells of the non-volatile memory 400 are each a binary memory cell that holds a logic value of "0" or "1". The patterns of errors occurring in the binary memory cell include a pattern where "0" has been inverted to "1" and a pattern where "1" has been inverted to "0". As RD progresses, a characteristic value (for example, the resistance) of the memory cell generally changes in a specific direction in accordance with the progress of RD. For example, when the ReRAM is used as a memory cell, the resistance of the memory cell changes from low to high as RD progresses. Therefore, in the case where "1" is assigned to a low resistance state and "0" is assigned to a high resistance state, an RD error having a pattern where "1" has been inverted to "0" may occur due to the RD of the memory cell. The refresh control unit 330 specifies memory cells in which "1" has been inverted to "0" and generates a bit select signal selecting the memory cells. The refresh control unit 330 provides the issued refresh request and the generated bit select signal to the non-volatile memory 400.

Although the refresh control unit 330 issues a refresh request when the number of corrections is equal to or greater than N, the refresh control unit 330 may also issue a refresh request upon detecting an error, regardless of the number of corrections. However, it is preferable that the refresh control unit 330 issue a refresh request when the number of corrections is equal to or greater than N since the access efficiency may be reduced in the configuration wherein the refresh control unit 330 issues a refresh request each time an error is detected.

Although the refresh control unit 330 specifies, as rewriting targets, only memory cells in which an error has occurred in a pattern which is assumed to have an RD error (such as a pattern where "1" has been inverted to "0"), the refresh control unit 330 is not limited to this configuration. The refresh control unit 330 may also generate a bit select signal selecting all memory cells in which an error has occurred as rewriting targets. However, in the case where all memory cells in which an error has occurred are selected as rewriting targets, data is rewritten even to memory cells with a non-RD error, causing progress of the degradation of memory cells. Therefore, it is preferable that only memory cells, in which an error has occurred in a pattern which is assumed to have an RD error, be selected as rewriting targets.

[Example of Configuration of Non-volatile Memory]

Figure 4:
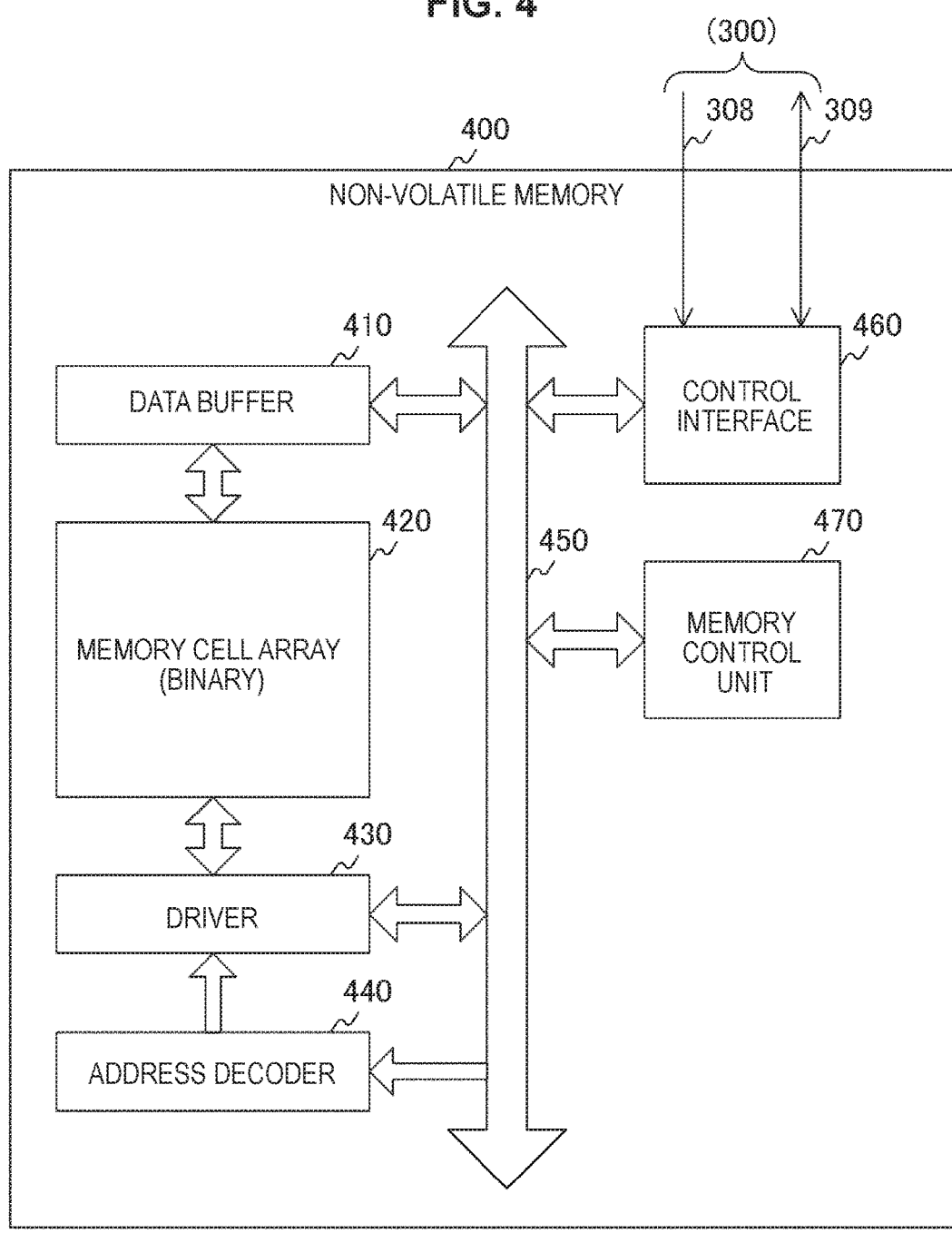
FIG. 4 is a block diagram illustrating an example of a configuration of a non-volatile memory according to the first embodiment.

FIG. 4 is a block diagram illustrating an example of a configuration of the non-volatile memory according to the first embodiment. The non-volatile memory 400 includes a data buffer 410, a memory cell array 420, a driver 430, an address decoder 440, a bus 450, a control interface 460, and a memory control unit 470.

The data buffer 410 holds write data and read data in access units according to control of the memory control unit 470. The memory cell array 420 includes a plurality of memory cells arrayed in a matrix shape. Non-volatile memory elements are used as these memory cells. Specifically, a NAND-type or NOR-type flash memory, a ReRAM, a PCRAM, STT-RAM, a MRAM, and the like are used as the memory elements.

These memory cells are each a binary memory cell that holds a logic value of "1" or "0". The access unit of the non-volatile memory 400 is, for example, a word including 8 bits. For example, the memory cell array 420 holds data of 256 words when 8×256 memory cells are provided in the memory cell array 420. A physical address is assigned to each of the words.

The driver 430 is configured to write or read data to or from a memory cell selected by the address decoder 440. The driver 430 performs data writing by applying one of two voltage pulses with different polarities to the memory cell to write "1" or "0" to the memory cell. In the following description, "to set" is defined as to perform an operation for writing "1" and a corresponding voltage pulse is referred to as a "set pulse". On the other hand, "to reset" is defined as to perform an operation for writing "0" and a corresponding voltage pulse is referred to as a "reset pulse".

The driver 430 performs data reading by applying a current pulse to the memory cell and comparing a voltage applied between the electrodes of the memory cell with a predetermined reference voltage $V_{ref}$. The driver 430 reads a result of the comparison as a value of the read data. In the following description, "to sense" is defined as to perform this operation and a corresponding current pulse is referred to as a "sense pulse". In case of the ReRAM, the reference voltage $V_{ref}$ is represented by the following equation.

$$V_{ref} = I \times R_{ref}$$

Here, I is the current value of the sense pulse and $R_{ref}$ is the reference resistance.

When setting, resetting, or sensing is performed, the driver 430 may select memory cells on a bit by bit basis in accordance with control of the memory control unit 470 to set, reset, or sense only the memory cells.

The address decoder 440 is configured to analyze an address designated by a request and to select memory cells corresponding to the address. For example, when the result of the analysis is that the address is "0x0F" (15 in decimal), the address decoder 440 selects 8 memory cells corresponding to the 16th from the beginning of 256 addresses.

The bus 450 is a path shared by the data buffer 410, the memory cell array 420, the address decoder 440, the memory control unit 470, and the control interface 460 for mutually exchanging data. The control interface 460 is an interface through which the memory controller 300 and the non-volatile memory 400 exchange data with each other.

The memory controller 470 is configured to control the driver 430 and the address decoder 440 such that they perform data writing or reading.

[Example of Configuration of Memory Control Unit]

Figure 5:
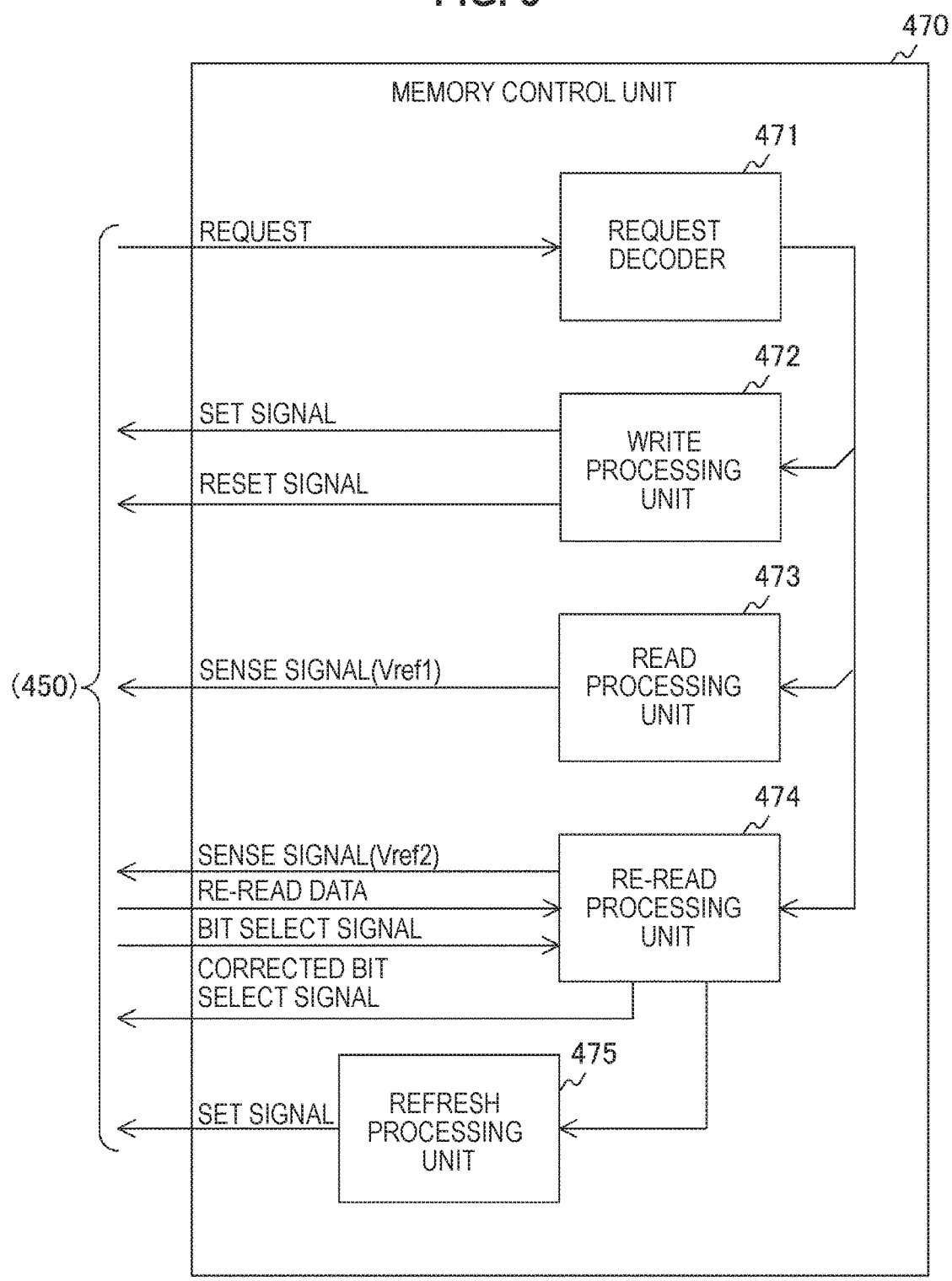
FIG. 5 is a block diagram illustrating an example of a configuration of the memory control unit according to the first embodiment.

FIG. 5 is a block diagram illustrating an example of a configuration of the memory control unit 470 according to the first embodiment. The memory control unit 470 includes a request decoder 471, a write processing unit 472, a read processing unit 473, a re-read processing unit 474, and a refresh processing unit 475.

The request decoder 471 is configured to analyze (decode) a request from the memory controller 300. This request decoder 471 provides the decoding result of a write request to the write processing unit 472 and provides the decoding result of a read request to the read processing unit 473. In addition, the request decoder 471 provides the decoding result of a refresh request to the re-read processing unit 474.

The write processing unit 472 is configured to control the driver 430 and the address decoder 440 such that they perform data writing. Upon receiving the decoding result, the write processing unit 472 provides a control signal instructing that address decoding be performed to the address decoder 440. In addition, the write processing unit 472 provides both a bit select signal selecting all bits and a sense signal instructing that sensing be performed to the driver 430. The control signal provided to the address decoder 440 and the bit select signal provided to the driver 430 are omitted in FIG. 5. The driver 430 reads, as pre-read data, data written at an address designated by the request in accordance with the sense signal and the bit select signal.

The write processing unit 472 compares write data and pre-read data on a bit by bit basis and specifies a bit, which is "1" in the write data and "0" in the pre-read data, as a setting target. The write processing unit 472 provides, to the driver 430, both a bit select signal indicating the setting target bit and a set signal instructing that setting be performed.

The write processing unit 472 then compares write data and pre-read data, which has been acquired after the set process, on a bit by bit basis and specifies a bit, which is "0" in the write data and "1" in the pre-read data, as a resetting target. The write processing unit 472 provides, to the driver 430, both a bit select signal indicating the resetting target bit and a reset signal instructing that resetting be performed. The driver 430 performs data writing in accordance with the bit select signal, the set signal, and the reset signal.

The read processing unit 473 is configured to control the driver 430 and the address decoder 440 such that they perform data reading. This read processing unit 473 provides a control signal instructing that address decoding be performed to the address decoder 440. The read processing unit 473 also sets the reference voltage $V_{ref}$ to $V_{ref1}$ and provides a sense signal and a bit select signal to the driver 430. This bit select signal allows all memory cells to be selected. For example, all bits of the bit select signal are set to "1".

The re-read processing unit 474 is configured to control the driver 430 and the address decoder 440 such that they perform data re-reading. Upon receiving the decoding result, the re-read processing unit 474 provides a control signal instructing that address decoding be performed to the address decoder 440. The re-read processing unit 474 sets the reference voltage $V_{ref}$ to $V_{ref2}$ and provides a sense signal to the driver 430. In addition, a bit select signal provided from the memory controller 300 is transmitted to the driver 430. The driver 430 reads data as re-read data in accordance with the sense signal and the bit select signal. No sense pulse is applied to memory cells which are not selected by the bit select signal.

Here, let $R_{ref1}$ be a reference resistance corresponding to the reference voltage $V_{ref1}$ used when read data is read and $R_{ref2}$ be a reference resistance corresponding to the reference voltage $V_{ref2}$ used when re-read data is read. In the case where the resistance of a memory cell increases as RD progresses, $R_{ref2}$ is higher than $R_{ref1}$ and $V_{ref1}$ and $V_{ref2}$ are set such that the difference between $R_{ref1}$ and $R_{ref2}$ is greater than a change of the resistance due to a single reading. The reference resistance $R_{ref1}$ is an example of the first threshold described in the claims and the reference resistance $R_{ref2}$ is an example of the second threshold described in the claims.

The re-reading processing unit 474 compares the re-read data and the bit select signal on a bit by bit basis and corrects the bit select signal on the basis of the comparison. This correction is performed in such a manner that bits having the same values as those of the read data among bits which have been selected as rewriting targets by the bit select signal are excluded from the rewriting targets. For example, in the case where only memory cells in which "1" has been inverted to "0" are selected as rewriting targets by the bit select signal, bits which are "0" in the re-read data are excluded from the rewriting targets since the bits have the same values as those of the read data. The re-read processing unit 474 provides the bit select signal acquired through such correction, as a corrected bit select signal, to the driver 430 and notifies the refresh processing unit 475 that the re-read data has been read. The corrected bit select signal allows only memory cells, for which the read data and the re-read data have different values, to be rewritten.

The refresh processing unit 475 is configured to control the driver 430 such that the driver 430 performs data rewriting. When re-read data has been read, the refresh processing unit 475 generates and provides one of a set signal and a reset signal to the driver 430. For example, the refresh processing unit 475 generates a set signal when a memory cell in which "1" has been inverted to "0" has been selected as a rewriting target by the bit select signal.

FIG. 6 is a table illustrating an example of an operation of the non-volatile memory 400 for each request according to the first embodiment. When a write request and write data have been input, the non-volatile memory 400 sequentially performs setting and resetting to write the write data to a memory cell. On the other hand, when a read request has been input, the non-volatile memory 400 reads read data on the basis of the reference voltage $V_{ref1}$ and outputs the read data to the memory controller 300.

In addition, when a refresh request and a bit select signal have been input, the non-volatile memory 400 reads re-read data on the basis of the reference voltage $V_{ref2}$ and sets only bits which have been read as a value of "1".

FIG. 7 is a view illustrating an example of a resistance distribution of memory cells before the occurrence of RD (i.e., immediately after rewriting) according to the first embodiment. In FIG. 7, the vertical axis represents the number of memory cells and the horizontal axis represents the resistance. The resistance distribution of binary memory cells of the ReRAM is divided at a threshold resistance ($R_{ref1}$ or the like) into two parts. The two parts of the distribution are referred to as a low-resistance state (LRS) and a high-resistance state (HRS). For example, a logic value of "1" is allocated to the LRS and a logic value of "0" is allocated to the HRS. When the threshold has been changed, the value of data is determined based on the changed threshold.

Although "1" is allocated to the LRS while "0" is allocated to the HRS, "0" may also be allocated to the LRS while "1" is allocated to the HRS. In this case, memory cells in which "0" has been inverted to "1" are selected as rewriting targets and memory cells from which "0" has been read on the basis of $R_{ref2}$ are reset to "0".

Figure 8:
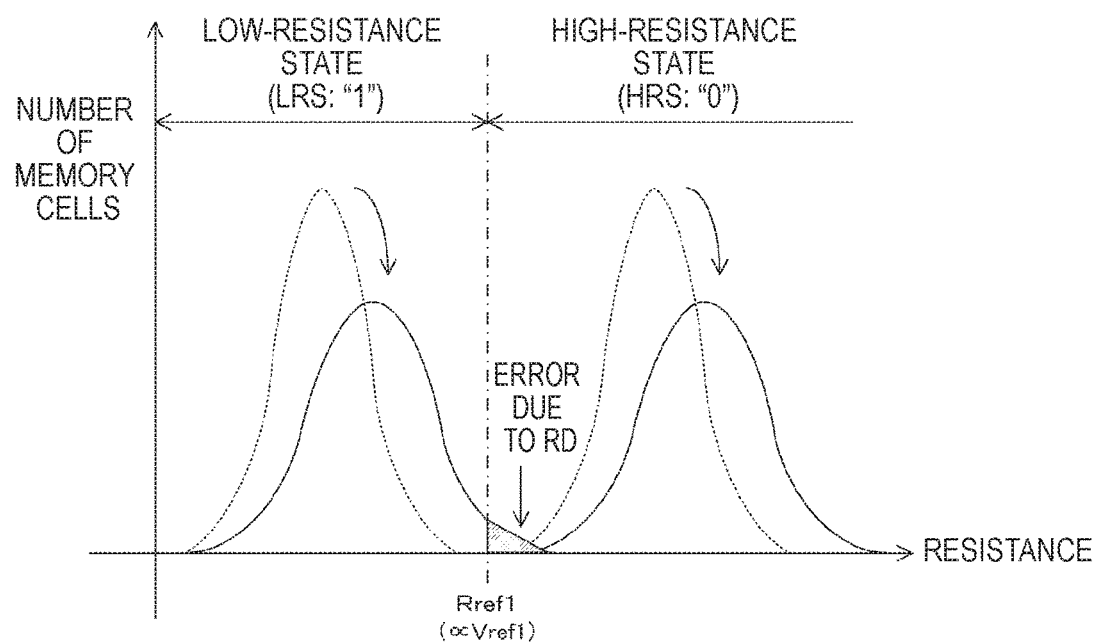
FIG. 8 is a view illustrating an example of a resistance distribution of memory cells after reading is repeated according to the first embodiment.

FIG. 8 is a view illustrating an example of a resistance distribution of memory cells after reading is repeated according to the first embodiment. In FIG. 8, the vertical axis represents the number of memory cells and the horizontal axis represents the resistance. In FIG. 8, dotted curves represent the states of memory cells immediately after rewriting and solid curves represent the states of memory cells that have changed due to repetition of reading by sense signals. As exemplified in FIG. 8, it is known that repetition of reading causes the resistance to deviate higher. This phenomenon is called "RD". Due to RD, the right end of the solid curved line exceeds the threshold ($R_{ref1}$), causing an RD error such that "0" is read from a bit to which "1" has been written. A hashed part in FIG. 8 is a portion where RD errors have occurred.

Figure 9:
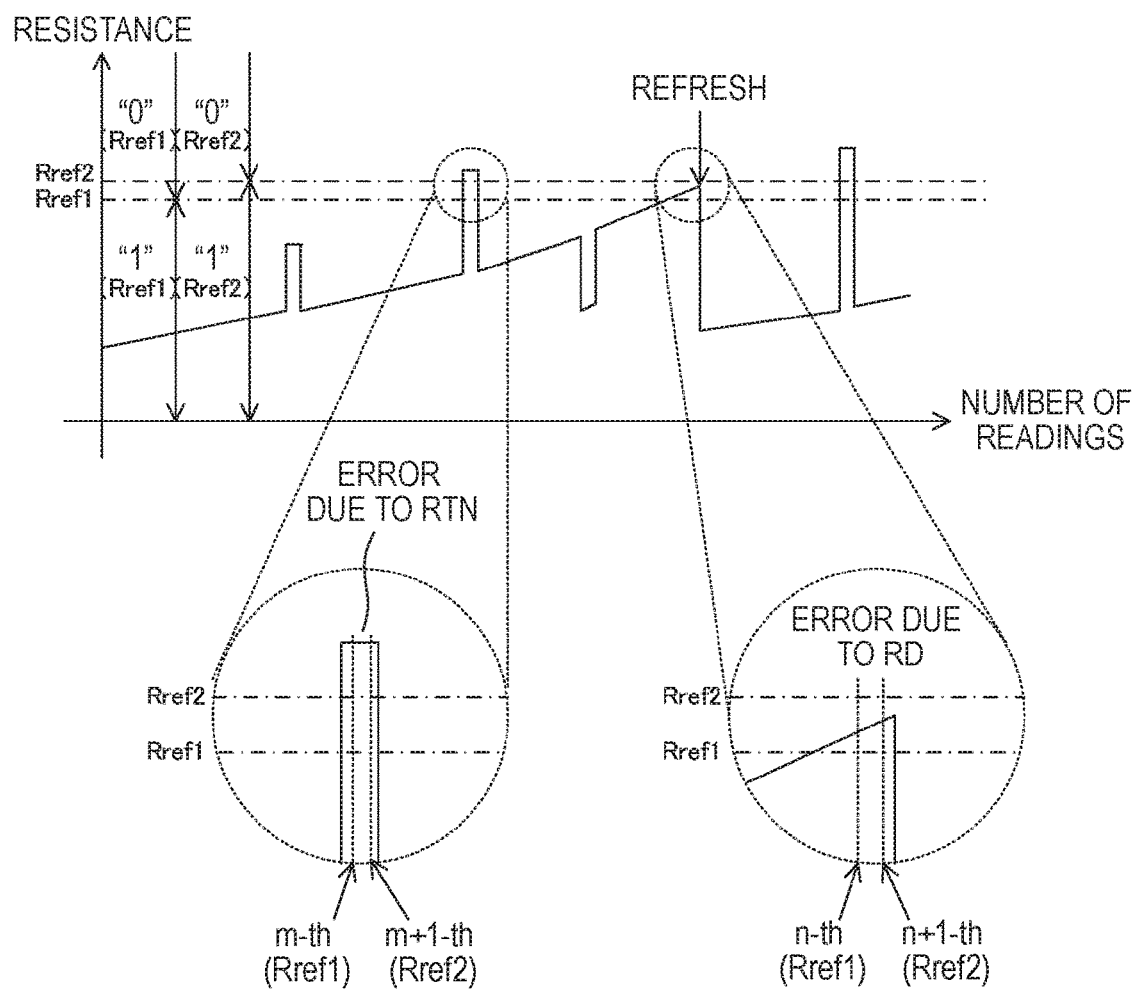
FIG. 9 is a view illustrating an example of a change of resistance as the number of readings increases according to the first embodiment.

FIG. 9 is a view illustrating an example of a change of resistance as the number of readings increases according to the first embodiment. In FIG. 9, the vertical axis represents the resistance and the horizontal axis represents the number of readings. Here, let us assume that "1" corresponding to the LRS has been written to a memory cell. At the first reading shown at the left end, the resistance is lower than the reference resistance $R_{ref1}$ and a value of "1" is normally read. However, at the m-th reading, the resistance discontinuously increases due to RTN. As a result, an RTN error occurs such that a value of "0" corresponding to the FIRS is erroneously read. This phenomenon is described, for example, in "Stability Conditioning to Enhance Read Stability 10× in 50 nm AlxOy ReRAM", by T. O. Iwasaki, et al., IEEE International Memory Workshop 2013. The memory controller 300 detects an error from the m-th read data and issues a refresh request and the non-volatile memory 400 changes the reference resistance to $R_{ref2}$ and performs re-reading as an m+1-th reading. Unless a certain time has passed, the RTN error is not corrected and changing the reference resistance does not change the read value such that the value "0" is read again. In this case, the memory cell is not refreshed since the values of the read data and the re-read data are the same.

Let us assume that the resistance has increased due to RD as reading is repeated subsequent to the m+1-th reading such that the resistance has exceeded the reference resistance $R_{ref1}$ at the n-th reading. As a result, an RD error occurs such that a value of "0" corresponding to the FIRS is erroneously read. Once an RD error occurs, the influence of RD is not eliminated unless refresh is performed and an incorrect value of "0" is read at the subsequent readings.

Thus, upon detecting an error from the n-th read data, the memory controller 300 issues a refresh request to correct the error and the non-volatile memory 400 changes the reference resistance to $R_{ref2}$ and performs re-reading as an n+1-th reading. At the n+1-th reading, the resistance does not exceed $R_{ref2}$ although the resistance has increased slightly due to RD since the difference between $R_{ref1}$ and $R_{ref2}$ is greater than the increase of the resistance. Therefore, a correct logic value of "1" is read at the n+1-th reading. Then, the non-volatile memory 400 applies a set pulse to the memory cell since "1" has been read at the n+1-th reading. This causes the resistance of the memory cell to drop below $R_{ref1}$ such that a correct logic value is read with both the reference resistances $R_{ref1}$ and $R_{ref2}$. In this manner, the RD error can be corrected through reapplication of a set pulse.

On the other hand, for the RTN error, there is no need to perform a refresh through reapplication of a set pulse (or a reset pulse) since the RTN error is a temporal state change, unlike the RD error. For example, performing a refresh through reapplication of a set pulse upon the occurrence of an RTN error at the m-th reading degrades the cell characteristics of the memory cell since an excessive set pulse is applied to the memory cell having a high resistance even though the influence of the RTN has disappeared at the moment of the reapplication of the set pulse. Thus, in the memory system of Patent Literature 2 or the like in which a refresh is also performed for an RTN error, the degradation of the memory cells may rather progress due to unnecessary refreshes, reducing the lifetime of the non-volatile memory 400.

On the contrary, the non-volatile memory 400 performs a refresh for an RD error and does not perform a refresh for an RTN error, thereby suppressing the degradation of the memory cell.

FIGS. 10a, 10b, 10c, 10d and 10e are views illustrating an example of read data and a bit select signal according to the first embodiment. FIG. 10a shows exemplary read data which has been read based on the reference voltage Vref1. This read data includes, for example, a bit sequence of "b11100000". FIG. 10b denotes exemplary decoded data. This decoded data includes, for example, a bit sequence of "b11100011". When the read data and the decoded data are compared on a bit by bit basis, an error occurs at each of the 7th and 8th bits, counted from the beginning bit. An error having a pattern where "1" has been inverted to "0" occurs in each of the 7th and 8th bits since their values are "0" before decoding and "1" after decoding. The resistance of the ReRAM tends to increase as the number of readings increases as described above. Therefore, an RD error in which "1" has been inverted to "0" may occur when "1" has been allocated to the LRS. However, "1" may also be inverted to "0" due to an RTN error. Here, it is not possible to determine whether the error in which "1" has been inverted to "0" is an RD error or an RTN error.

FIG. 10c shows an example of a bit select signal. "0" in the bit select signal represents a bit which is not to be rewritten (i.e., which is not a rewriting target) and "1" represents a bit which is to be rewritten through setting (i.e., which is a rewriting target). A bit select signal including "b0000011" designating the 7th and 8th bits, which are assumed to have an RD error or an RTN error, is generated from the results of FIGS. 10a and 10b. The non-volatile memory 400 selects the 7th and 8th bits in accordance with the bit select signal and reads re-read data on the basis of the reference resistance Rref2.

FIG. 10d shows an example of the re-read data. FIG. 10d, shows bits to which no sense pulse is applied. For example, let us assume that the 7th bit of the re-read data is "0" and the 8th bit is "1". The value of the memory cell of the 7th bit among the memory cells which are selected as rewriting targets has not changed from the value of the read data while the value of the memory cell of the 8th bit is different from that of the read data. In this case, it is considered that the error of the 7th bit is an RTN error and the error of the 8th bit is an RD error. Accordingly, the non-volatile memory 400 corrects the bit select signal such that the 7th bit corresponding to the RTN error is not selected as a rewriting target. FIG. 10e shows an example of the corrected bit select signal. In the corrected bit select signal, the 7th bit among the 7th and 8th bits at which errors have been detected is corrected to "0". This allows the memory cell of the 8th bit to be refreshed through setting.

[Example of Operation of Storage]

Figure 11:
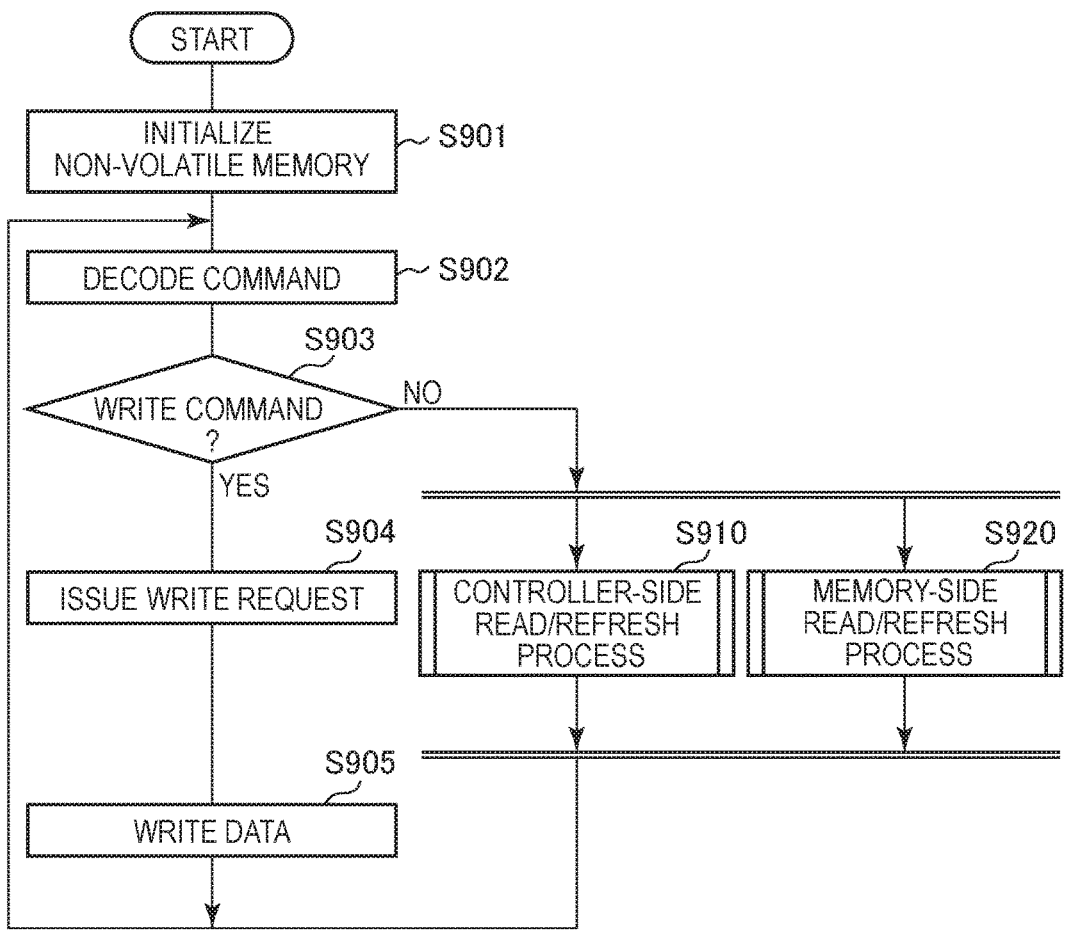
FIG. 11 is a flowchart showing an example of an operation of a storage according to the first embodiment.

FIG. 11 is a flowchart illustrating an example of an operation of the storage 200 according to the first embodiment. The storage 200 starts this operation when power has been applied to the storage 200 or when the host computer 100 has instructed that the storage 200 be initialized.

The memory controller 300 initializes the non-volatile memory 400 (step S901). The memory controller 300 decodes a command from the host computer 100 (step S902). When the command is a write command (step S903: Yes), the memory controller 300 issues a write request in accordance with the write command (step S904). The non-volatile memory 400 writes write data to a memory cell in accordance with the write request (step S905).

On the other hand, when the access command is a read command (step S903: No), the memory controller 300 performs a controller-side read/refresh process (step S910). The non-volatile memory 400 performs a memory-side read/refresh process (step S920). After step S905 or after both steps S910 and S920 are terminated, the storage 200 returns to step S902.

Figure 12:
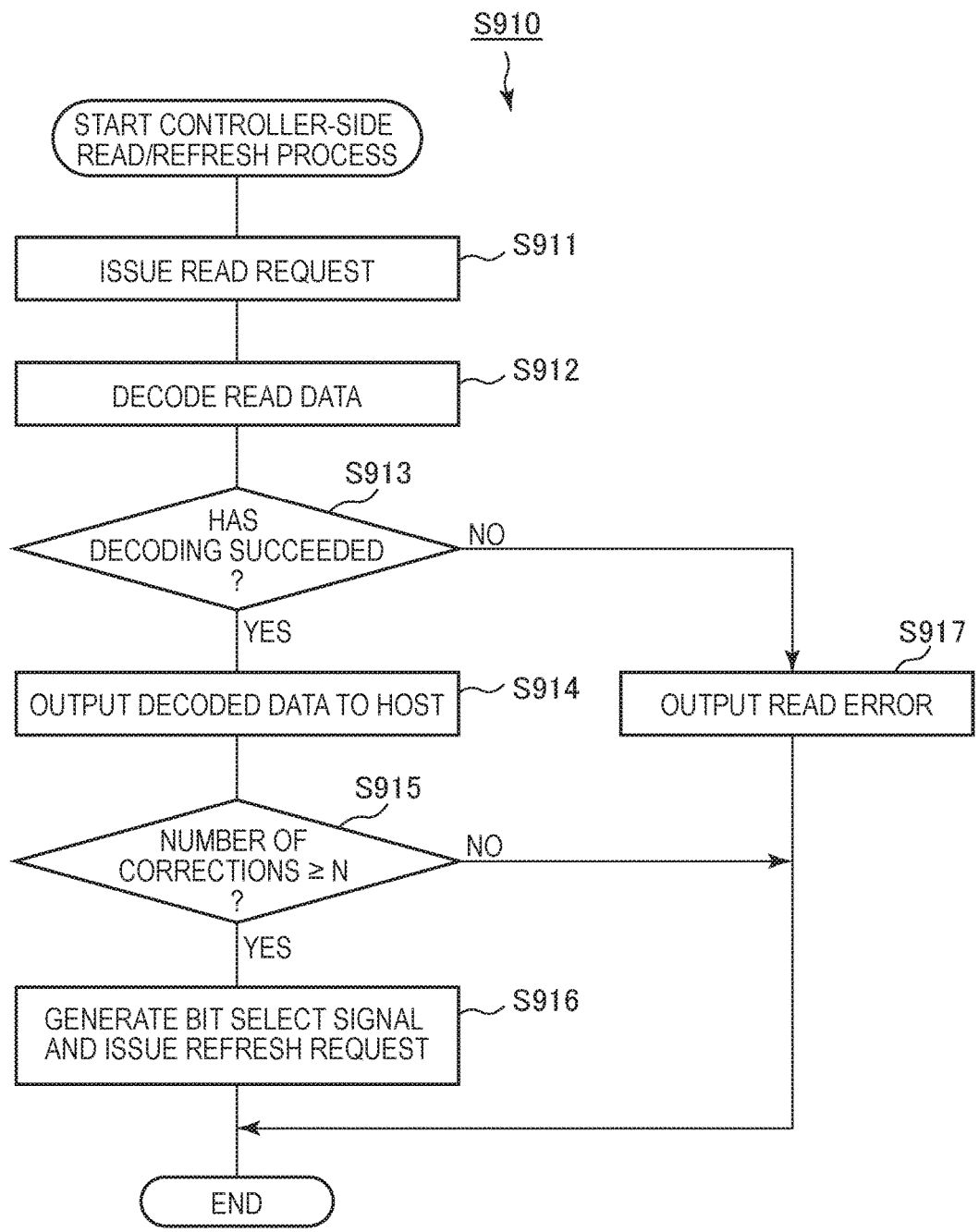
FIG. 12 is a flowchart illustrating an example of a controller-side read/refresh process according to the first embodiment.

FIG. 12 is a flowchart illustrating a controller-side read/refresh process according to the first embodiment. The memory controller 300 issues a read request (step S911). When read data has been read, the memory controller 300 decodes the data (step S912). Decoding succeeds when the number of errors is equal to or less than that of the error correction capability of the ECC.

The memory controller 300 determines whether or not decoding has succeeded (step S913). When decoding has succeeded (step S913: Yes), the memory controller 300 outputs the decoded data to the host computer 100 (step S914) and determines whether or not the number of corrections is equal to or greater than N (step S915). On the other hand, when decoding has failed (step S913: No), the memory controller 300 outputs a read error to the host computer 100 (step S917).

When the number of corrections is equal to or greater than N (step S915: Yes), the memory controller 300 generates a bit select signal selecting a memory cell, in which an error having a predetermined pattern has occurred, as a rewriting target and issues a refresh request (step S916). When the number of corrections is less than N (step S915: No) or after step S916 or after step S917, the memory controller terminates the controller-side read/refresh process.

Figure 13:
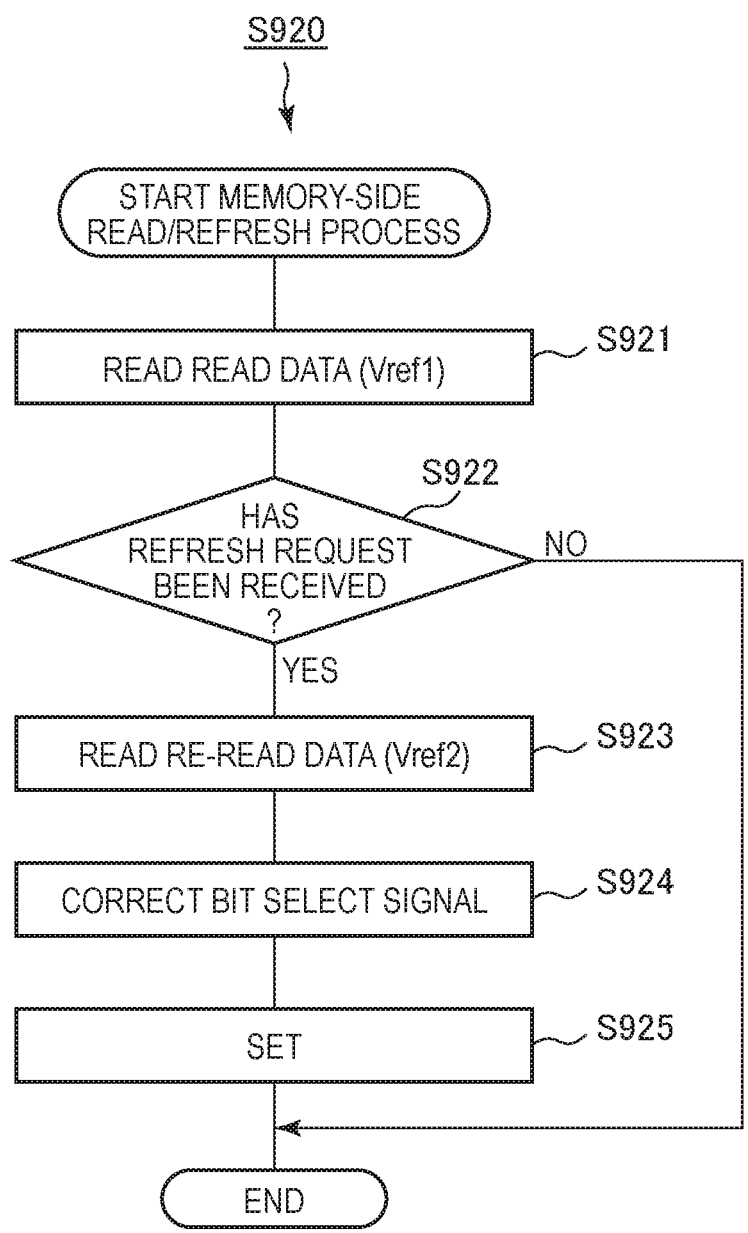
FIG. 13 is a flowchart illustrating an example of a memory-side read/refresh process according to the first embodiment.

FIG. 13 is a flowchart illustrating an example of a memory-side read/refresh process according to the first embodiment. The non-volatile memory 400 reads read data on the basis of the reference voltage $V_{ref1}$ in accordance with the read request (step S921). The non-volatile memory 400 then determines whether or not a refresh request has been received from the memory controller 300 within a predetermined period of time (step S922). When a refresh request has been received (step S922: Yes), the non-volatile memory 400 reads re-read data on the basis of the reference voltage $V_{ref2}$ in accordance with the request (step S923). The non-volatile memory 400 then corrects the bit select signal such that only memory cells whose read data and re-read data have different values are selected as rewriting targets (step S924). The non-volatile memory 400 performs a set operation on the memory cells indicated by the corrected bit select signal (step S925).

On the other hand, when a refresh request has not been received (step S922: No) or after step S925, the non-volatile memory 400 terminates the memory-side read/refresh process.

Figure 14:
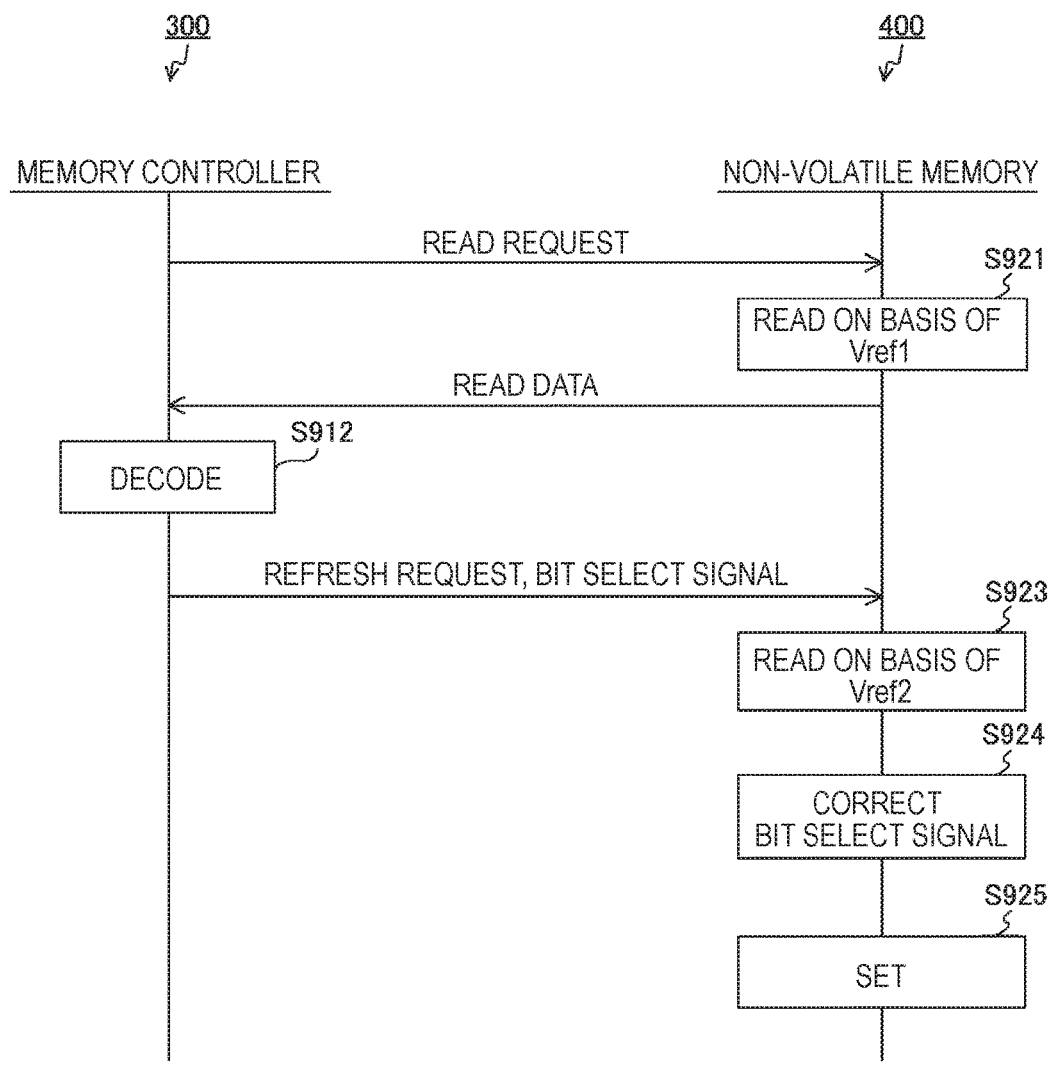
FIG. 14 is a sequence diagram illustrating an example of an operation of a storage according to the first embodiment.

FIG. 14 is a sequence diagram illustrating an example of an operation of the storage 200 according to the first embodiment. When the memory controller 300 has issued and transmitted a read request to the non-volatile memory 400, the non-volatile memory 400 reads read data on the basis of the reference voltage $V_{ref1}$ in accordance with the request (step S921). The memory controller 300 decodes the read data (step S912) and transmits a refresh request and a bit select signal to the non-volatile memory 400 when the number of errors is equal to or greater than N.

The non-volatile memory 400 reads re-read data on the basis of the reference voltage $V_{ref2}$ in accordance with the refresh request and the bit select signal (step S923). The non-volatile memory 400 then corrects the bits select signal such that only bits whose re-read data and read data have different values are selected as rewriting targets (S924) and refreshes the rewriting target bits through setting (step S925).

According to the first embodiment of the present technology, memory cells, which have different values for read data that is based on the first threshold and re-read data that is based on the second threshold, are refreshed in the above manner and therefore it is possible to refresh memory cells except those having the same values for read data and re-read data. This prevents unnecessary refreshes for memory cells which are likely to have an RTN error, thereby suppressing the progress of degradation of memory cells.

<2. Second Embodiment>

In the first embodiment described above, the memory controller 300 performs a refresh for an address each time the number of errors, which have occurred during a read process of the address, has become equal to or greater than a predetermined allowable value. However, performing a refresh process each time an error is detected may cause a reduction in the access speed since the non-volatile memory 400 cannot perform other request operations during a refresh process. Therefore, it is preferable that the memory controller 300 suppress issuance of a refresh request until a predetermined condition is satisfied and issue a write request or a read request in priority to the refresh request. Examples of the predetermined condition include that the host computer 100 has instructed that a refresh be performed or that the number of addresses to be refreshed has exceeded a predetermined number. The memory controller 300 of this second embodiment differs from that of the first embodiment in that a refresh request is issued when a predetermined condition has been satisfied.

Figure 15:
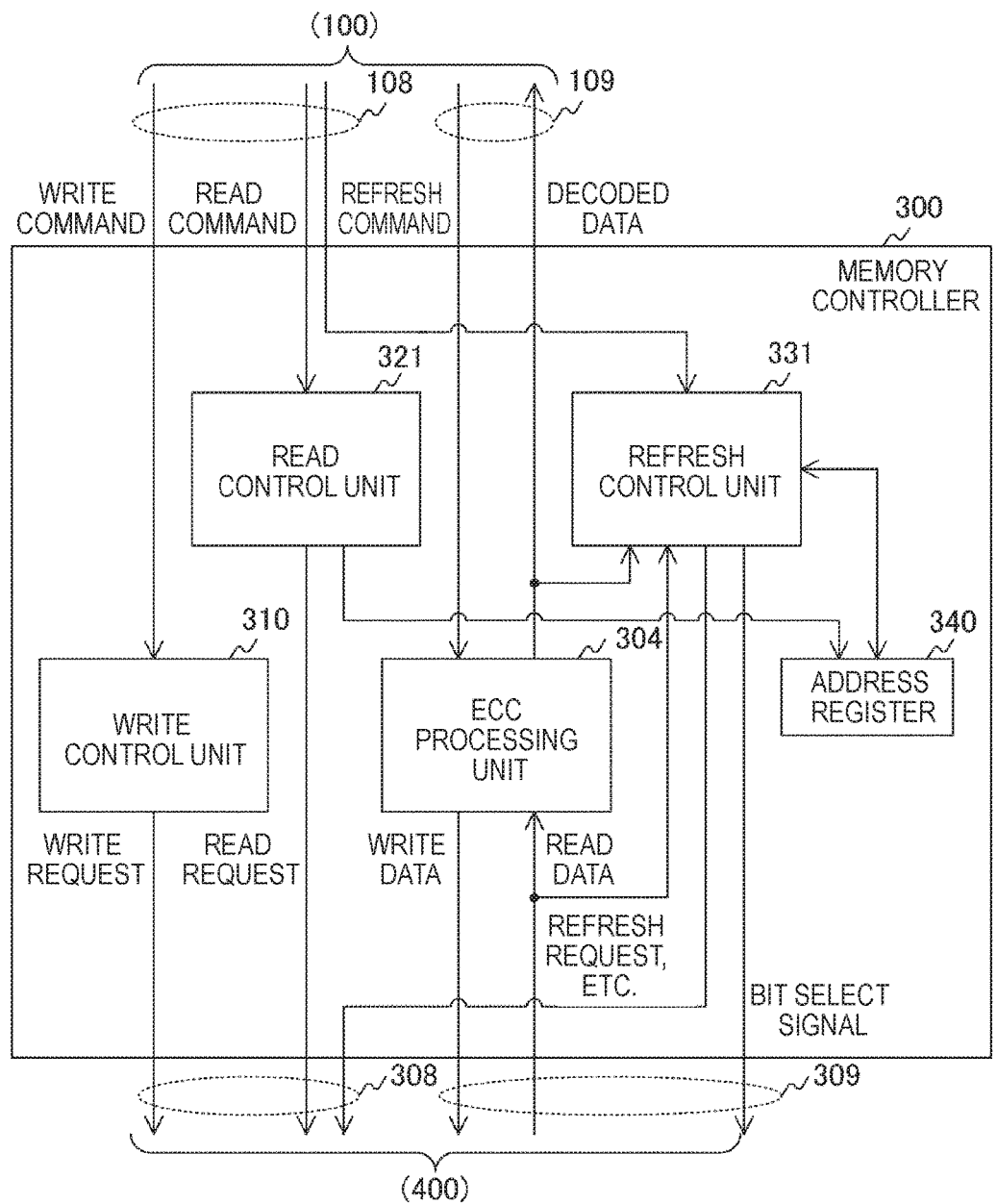
FIG. 15 is a block diagram illustrating an example of a functional configuration of the memory controller according to a second embodiment.

FIG. 15 is a block diagram illustrating an example of a functional configuration of the memory controller 300 according to the second embodiment. The memory controller 300 of the second embodiment differs from that of the first embodiment in that the memory controller 300 includes a read control unit 321 and a refresh control unit 331 instead of the read control unit 320 and the refresh control unit 330 and further includes an address register 340.

The read control unit 321 receives read data and decoded data from an ECC processing unit 304 and holds the address in the address register 340 each time a number of errors greater than an allowable value N have been detected. Read data and decoded data provided from the ECC processing unit 304 and the non-volatile memory 400 to the read control unit 321 are omitted in FIG. 15 for ease of description. The address register 340 is configured to hold a plurality of addresses. The address register 340 is an example of the address holding unit described in the claims.

In addition, when a refresh command has been received from the host computer 100, the refresh control unit 331 sequentially designates an address held in the address register 340 and issues a read request. Alternatively, when the number of addresses held in the address register 340 has become equal to or greater than M (M: integer), the refresh control unit 331 sequentially designates the addresses and issues read requests. Then, when the number of corrections is equal to or greater than N, the refresh control unit 332 provides a refresh request and a bit select signal to the non-volatile memory 400.

Further, the host computer 100 of the second embodiment issues a refresh command, for example, when the access frequency has been reduced below a predetermined level.

Figure 16:
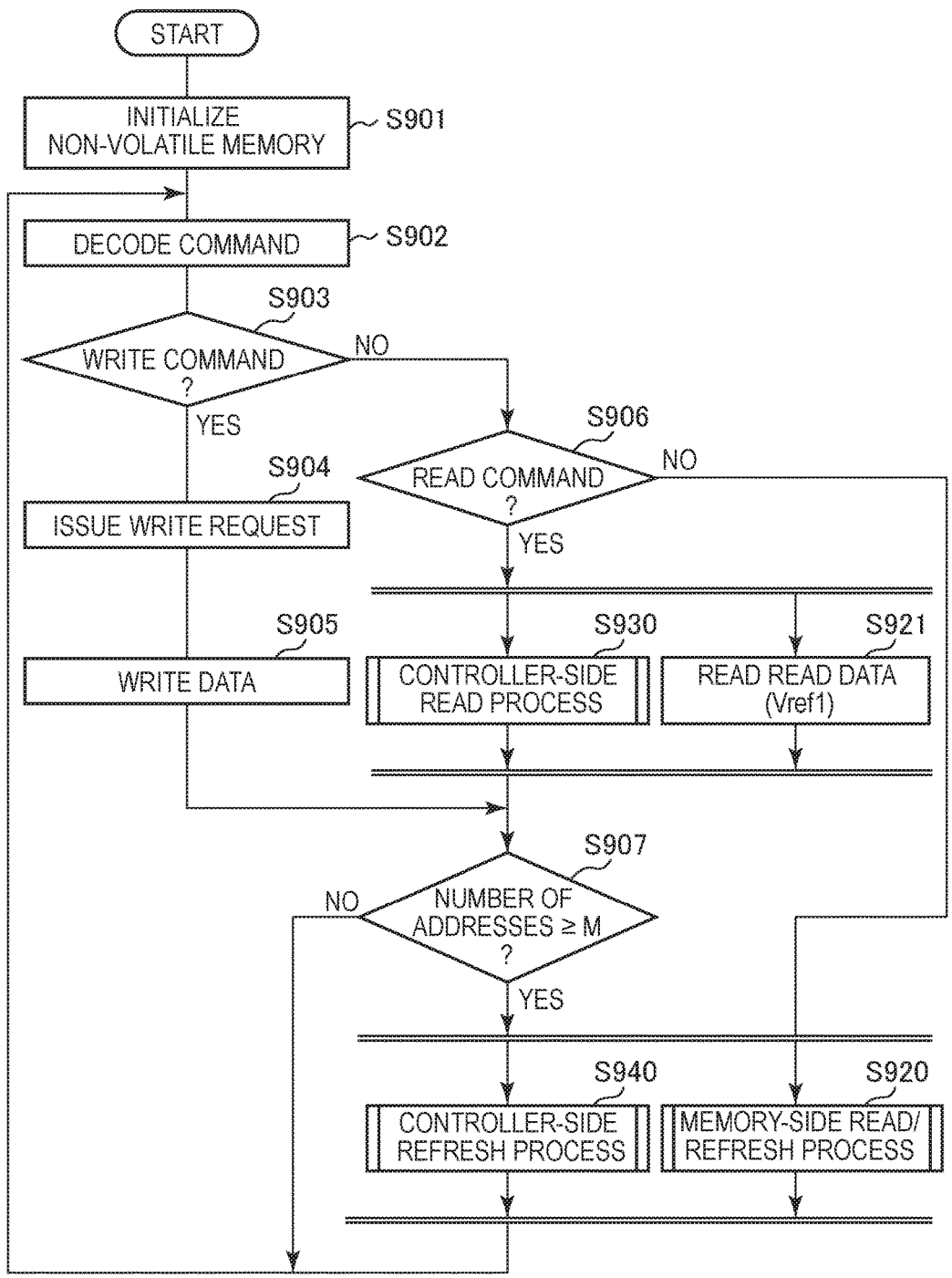
FIG. 16 is a flowchart showing an example of an operation of a storage according to the second embodiment.

FIG. 16 is a flowchart illustrating an example of an operation of the storage 200 according to the second embodiment. The memory controller 300 decodes a command (step S902) after the non-volatile memory 400 is initialized (step S901). The memory controller 300 determines whether or not the command is a write command (step S903) and performs steps S904 and S905 when it is a write command (step S903: Yes).

On the other hand, when the command is not a write command (step S903: No), the memory controller 300 determines whether or not the command is a read command (step S906). When the command is a read command (step S906: Yes), the memory controller 300 performs a controller-side read process (step S930). In addition, the non-volatile memory 400 reads read data on the basis of $V_{ref1}$ in accordance with a write request (step S921).

After step S905 or after both steps S930 and S921 are terminated, the non-volatile memory 400 determines whether or not the number of addresses held in the address register is equal to or greater than M (step S907).

When the command is a refresh command (step S906: No) or when the number of addresses is equal to or greater than M (step S907: Yes), the memory controller 300 performs a controller-side refresh process (step S940). In addition, the non-volatile memory 400 performs a memory-side read/refresh process (step S920). When the number of addresses is less than M (step S907: No) or after both steps S940 and S920 are terminated, the storage 200 returns to step S902.

Figure 17:
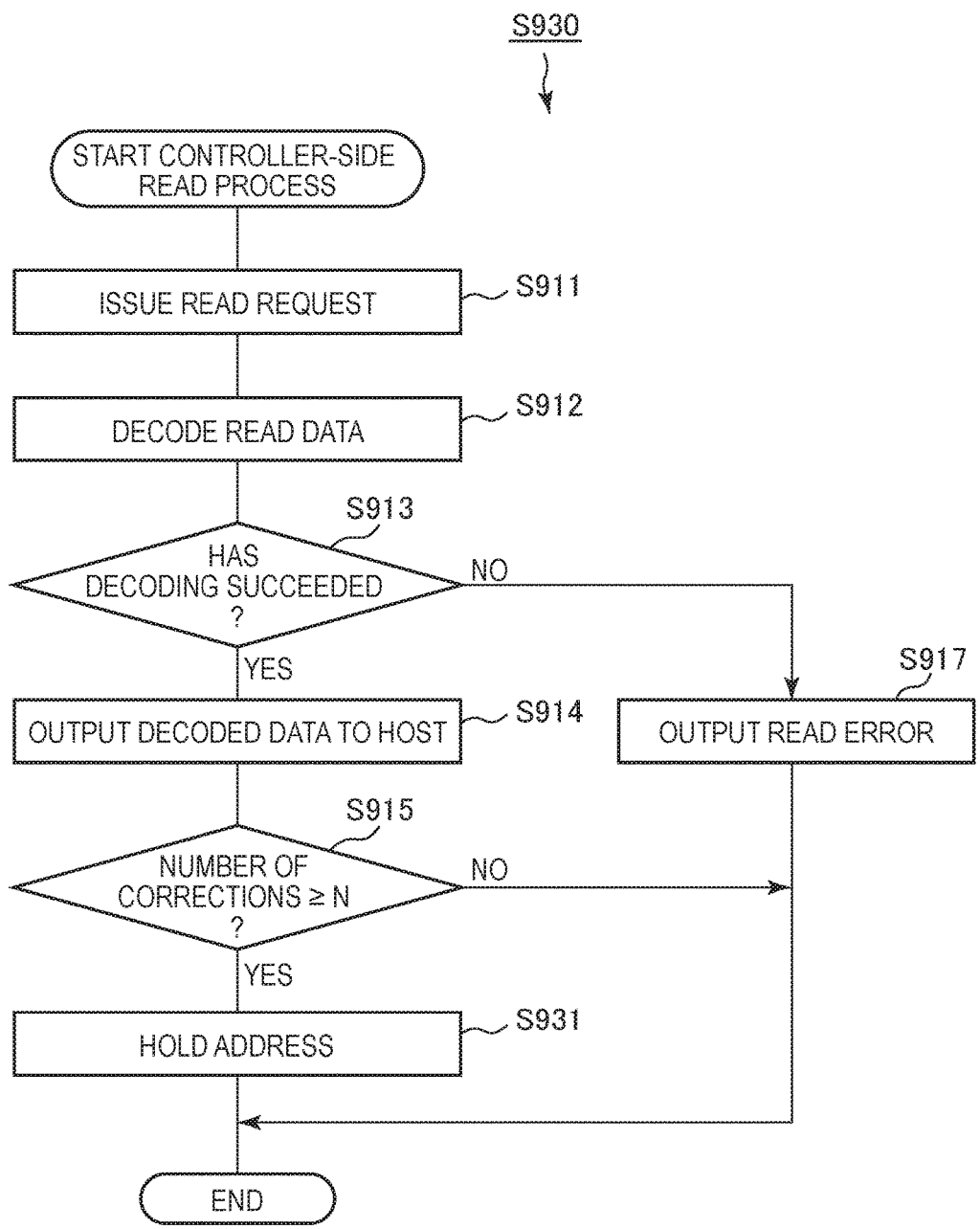
FIG. 17 is a flowchart illustrating an example of a controller-side read process according to the second embodiment.

FIG. 17 is a flowchart illustrating an example of a controller-side read process according to the second embodiment. The controller-side read process is similar to the controller-side read/refresh process exemplified in FIG. 12, except that step S931 is performed instead of step S916. When the number of corrections is equal to or greater than N (step S915: Yes), the memory controller 300 holds an address designated by a read request in the address register 340 (step S931).

Figure 18:
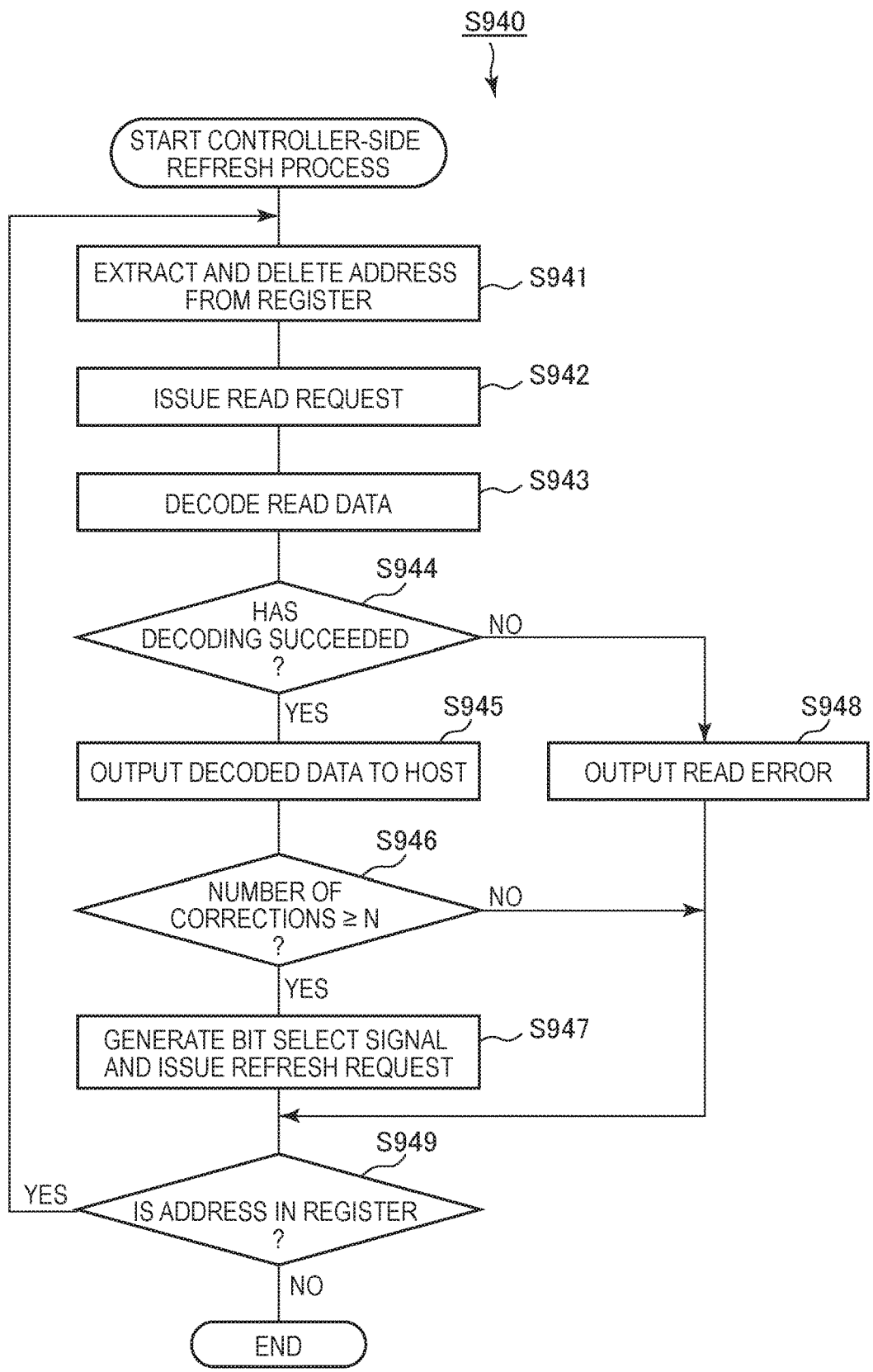
FIG. 18 is a flowchart illustrating an example of a controller-side refresh process according to the second embodiment.

FIG. 18 is a flowchart illustrating an example of a controller-side refresh process according to the second embodiment. The memory controller 300 extracts an address from the address register 340 and deletes the address from the address register 340 (step S941). The memory controller 300 issues a read request designating the extracted address (step S942). The memory controller 300 then decodes read data that has been read (step S943).

The memory controller 300 determines whether or not decoding has succeeded (S944). When decoding has succeeded (step S944: Yes), the memory controller 300 outputs the decoded data to the host computer 100 (step S945) and determines whether or not the number of corrections is equal to or greater than N (step S946).

When the number of corrections is equal to or greater than N (step S946: Yes), the memory controller 300 generates a bit select signal and issues and provides a refresh request to the non-volatile memory 400 (step S947).

When decoding has failed (step S944: No), the memory controller 300 outputs a read error to the host computer 100 (step S948). In addition, when the number of corrections is less than N (step S946: No) or after step S947 or after step S948, the memory controller 300 determines whether or not any address is present in the register (step S949). The memory controller 300 returns to step S941 when an address is present (step S949: Yes) and terminates the controller-side refresh process when no address is present (step S949: No).

Although the memory controller 300 performs decoding of read data in both the controller-side read process and the controller-side refresh process, it is also possible to employ a configuration wherein the memory controller 300 does not perform decoding in the controller-side refresh process. However, it is preferable that the memory controller 300 perform decoding also in the controller-side refresh process since an address, which is held during a period of time from when the controller-side read process is terminated to when the controller-side refresh process is started, may be accessed, causing progress of RD.

According to the second embodiment of the present technology, it is possible to increase the access efficiency since the memory controller 300 holds an address in which an error has occurred and performs a refresh of the address when a predetermined condition is satisfied thereafter.

<3. Third Embodiment>

In the first embodiment described above, the memory controller 300 performs a refresh for an address at each reading when the number of errors of read data of the address is equal to or greater than a predetermined allowable value. However, collectively performing a refresh when the access frequency for reading or writing has been reduced, rather than performing a refresh at each reading in accordance with the number of errors, can increase the access efficiency. For example, it is possible to employ a configuration wherein the host computer 100 sets a refresh mode when the access frequency has been reduced and the memory controller 300 performs a refresh when in the refresh mode. The memory system of this third embodiment differs from that of the first embodiment in that the memory controller 300 performs a refresh when the access frequency has been reduced such that the refresh mode is set.

Figure 19:
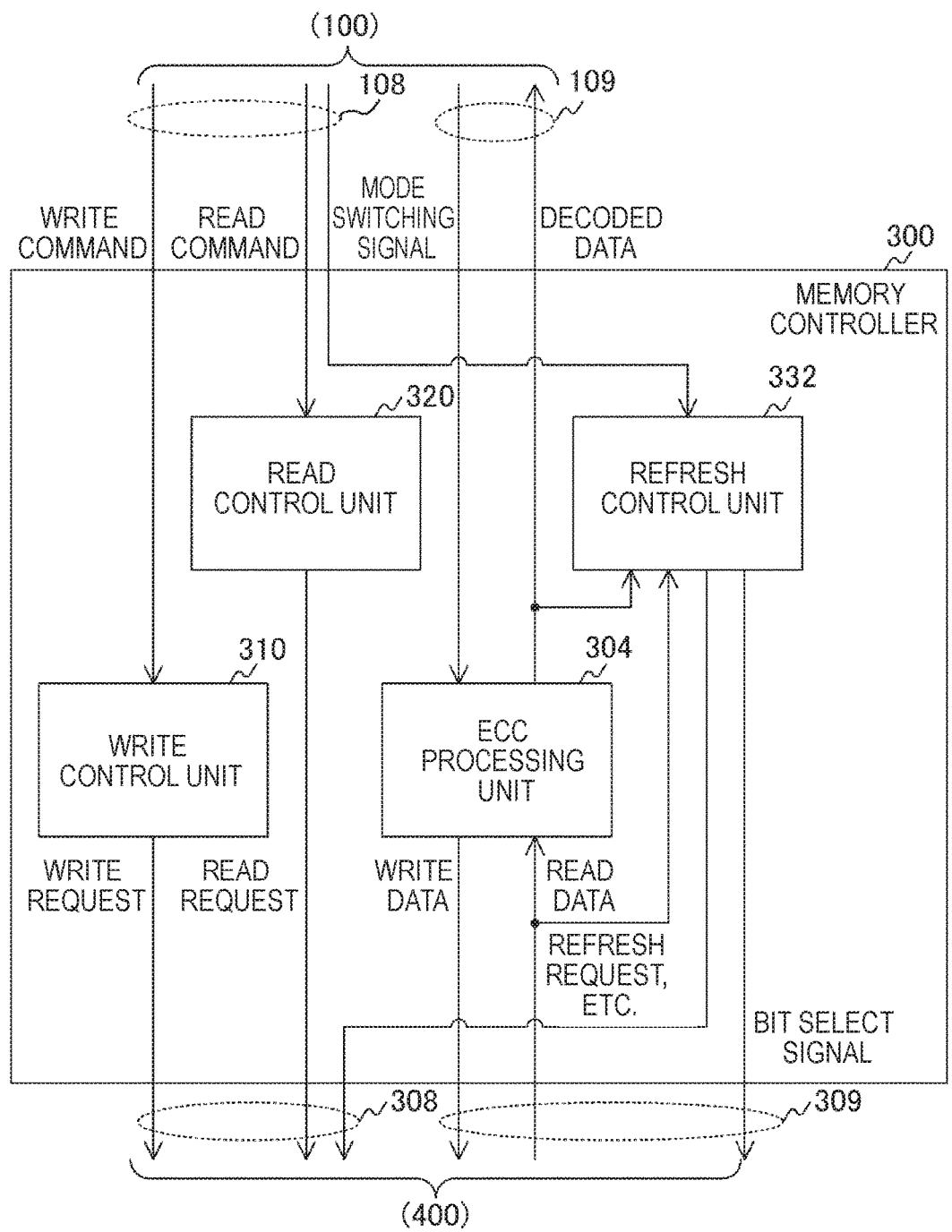
FIG. 19 is a block diagram illustrating an example of a functional configuration of the memory controller according to a third embodiment.

FIG. 19 is a block diagram illustrating an example of a functional configuration of the memory controller 300 according to the third embodiment. The memory controller 300 of the third embodiment differs from that of the first embodiment in that the memory controller 300 includes a refresh control unit 332 instead of the refresh control unit 330.

The refresh control unit 332 receives a mode switching signal from the host computer 100. This mode switching signal is a signal instructing that switching to one of a normal mode and a refresh mode be performed. Here, the normal mode is a mode for performing reading or writing. When switching to the refresh mode has been performed by the mode switching signal, the refresh control unit 332 sequentially designates every address of the non-volatile memory 400 and issues a read request. Then, the refresh control unit 332 provides a refresh request and a bit select signal to the non-volatile memory 400 when the number of corrections is equal to or greater than N.

When the access frequency has been reduced below a predetermined level, the host computer 100 of the third embodiment performs switching to the refresh mode, otherwise the host computer 100 performs switching to the normal mode.

Figure 20:
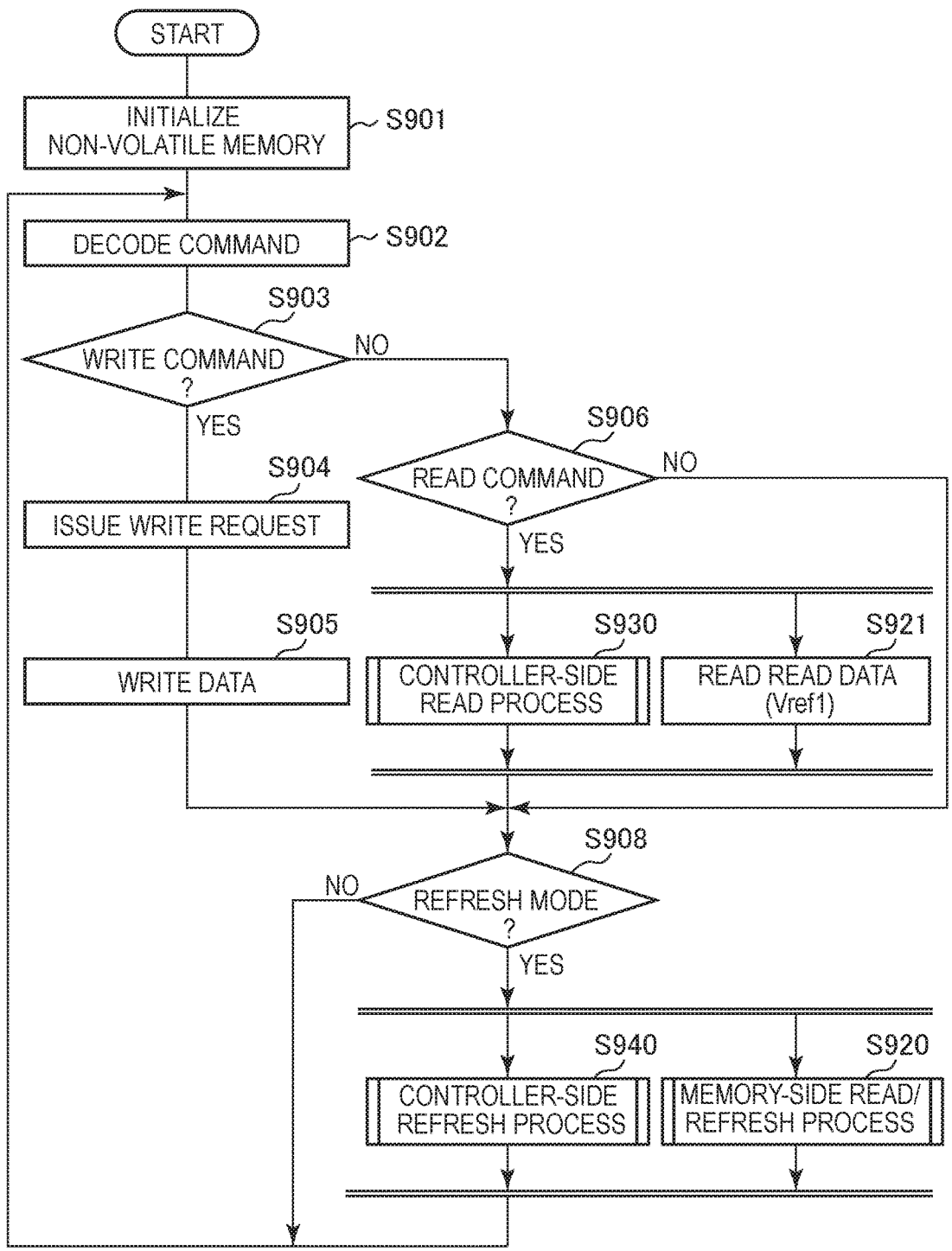
FIG. 20 is a flowchart showing an example of an operation of a storage according to the third embodiment.

FIG. 20 is a flowchart illustrating an example of an operation of the storage 200 according to the third embodiment. The operation of the storage 200 according to the third embodiment is similar to that of the second embodiment, except that the storage 200 performs step S908 instead of step S907.

When the command is not a read command (step S906: No) or after step S905 or after steps S930 and S921, the memory controller 300 determines whether or not switching to the refresh mode has been performed (step S908). When switching to the refresh mode has been performed (step S908: Yes), the memory controller 300 performs steps S940 and S920.

When switching to the refresh mode has not been performed (step S908: No) or after both steps S940 and S920 are terminated, the memory controller 300 returns to step S902.

Figure 21:
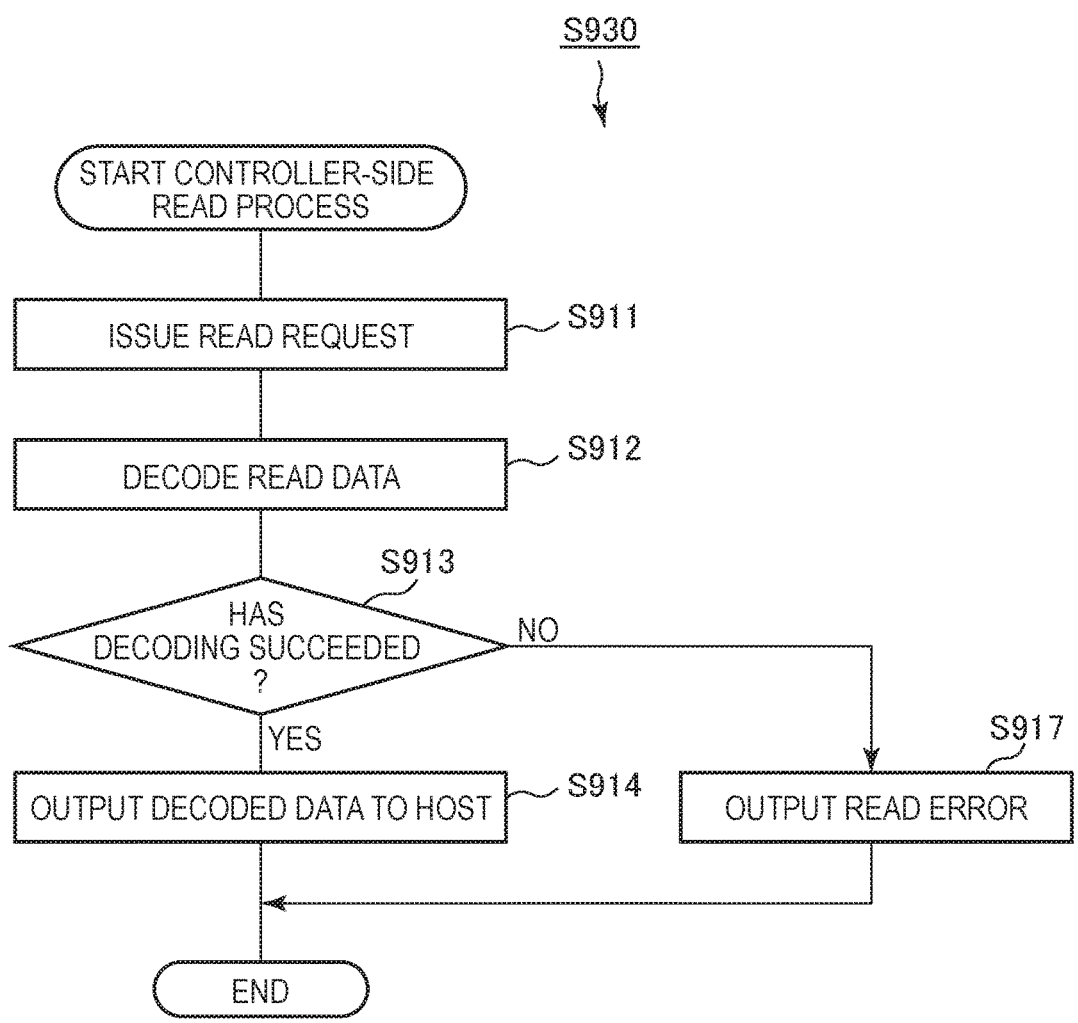
FIG. 21 is a flowchart illustrating an example of a controller-side read process according to the third embodiment.

FIG. 21 is a flowchart illustrating an example of a controller-side read process according to the third embodiment. The controller-side read process according to the third embodiment is similar to the controller-side read/refresh process of the first embodiment, except that steps S915 and S916 are not performed.

Figure 22:
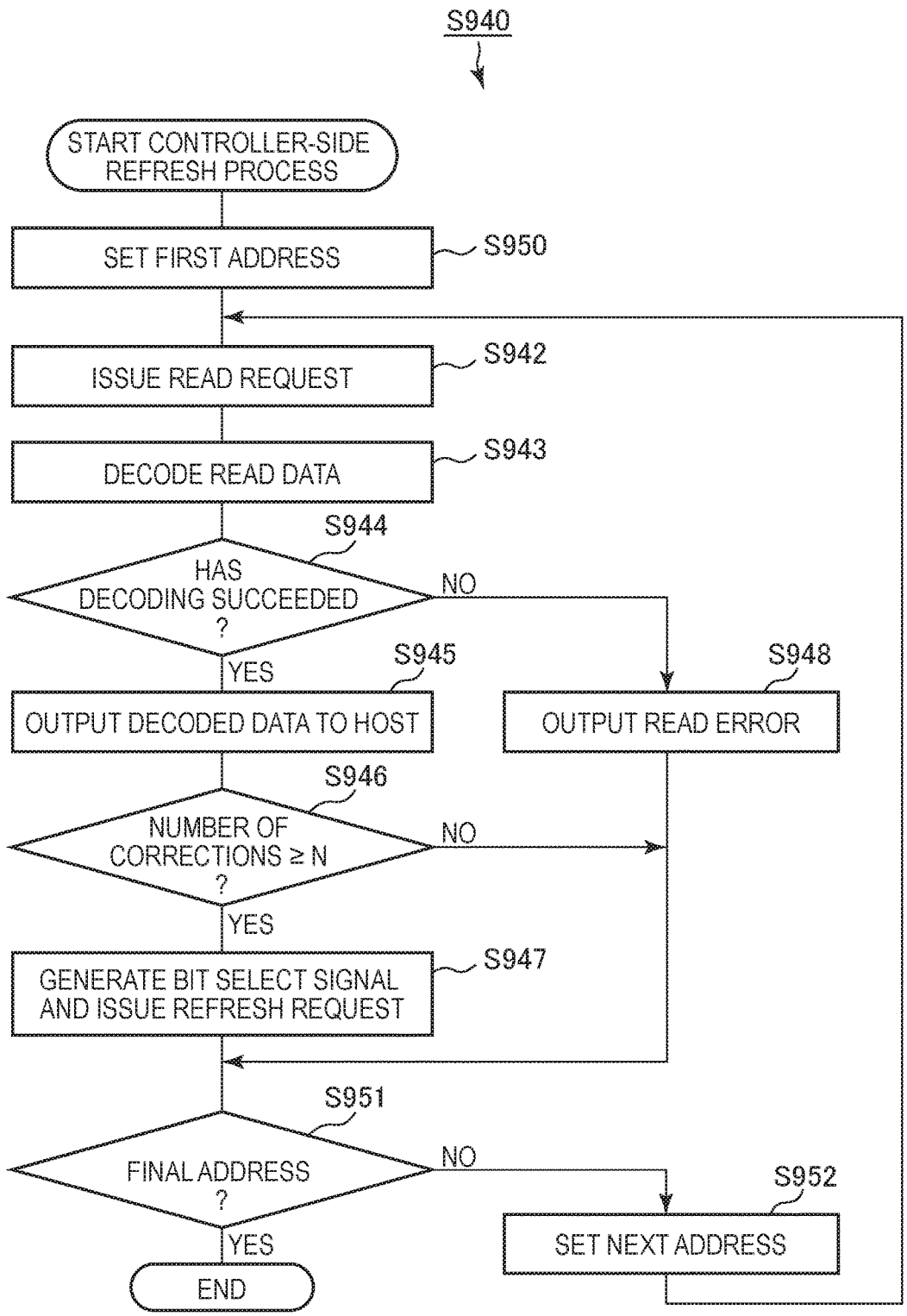
FIG. 22 is a flowchart illustrating an example of a controller-side refresh process according to the third embodiment.

FIG. 22 is a flowchart illustrating an example of a controller-side refresh process according to the third embodiment. The controller-side refresh process according to the third embodiment is similar to that of the second embodiment, except that steps S950, S951 and S952 are performed instead of steps S941 and S949.

The memory controller 300 sets the first address of the non-volatile memory 400 to a read address (step S950) and performs steps S942 to S948. Then, when the number of corrections is less than N (step S946: No) or after step S947 or after step S948, the memory controller 300 determines whether or not the read address is the final address of the non-volatile memory 400 (step S951). When the read address is not the final address (step S951: No), the memory controller 300 sets the next address to the read address (step S952) and returns to step S942. On the other hand, when the read address is the final address (step S951: Yes), the memory controller 300 terminates the controller-side refresh process.

According to the third embodiment of the present technology, it is possible to increase the access efficiency since the memory controller 300 performs a refresh when the refresh mode has been set as described above.

<4. Fourth Embodiment>

In the first embodiment described above, the memory controller 300 issues a refresh request when the number of errors has become equal to or greater than a predetermined allowable value. However, errors include different types, RD and RTN errors, and RD errors exhibit only a predetermined pattern such as the pattern in which "1" has been inverted to "0". Therefore, performing a refresh when the number of errors has become equal to or greater than N, regardless of the patterns of errors, may cause a reduction in the access efficiency since a refresh request is issued even when only non-RD errors have occurred. Accordingly, it is preferable that the memory controller 300 issue a refresh request when the number of errors having a predetermined pattern which is assumed to be an RD error is equal to or greater than a predetermined allowable value. The memory controller 300 of this fourth embodiment differs from that of the first embodiment in that the memory controller 300 issues a refresh request when the number of errors having the predetermined pattern is equal to or greater than N'.

Figure 23:
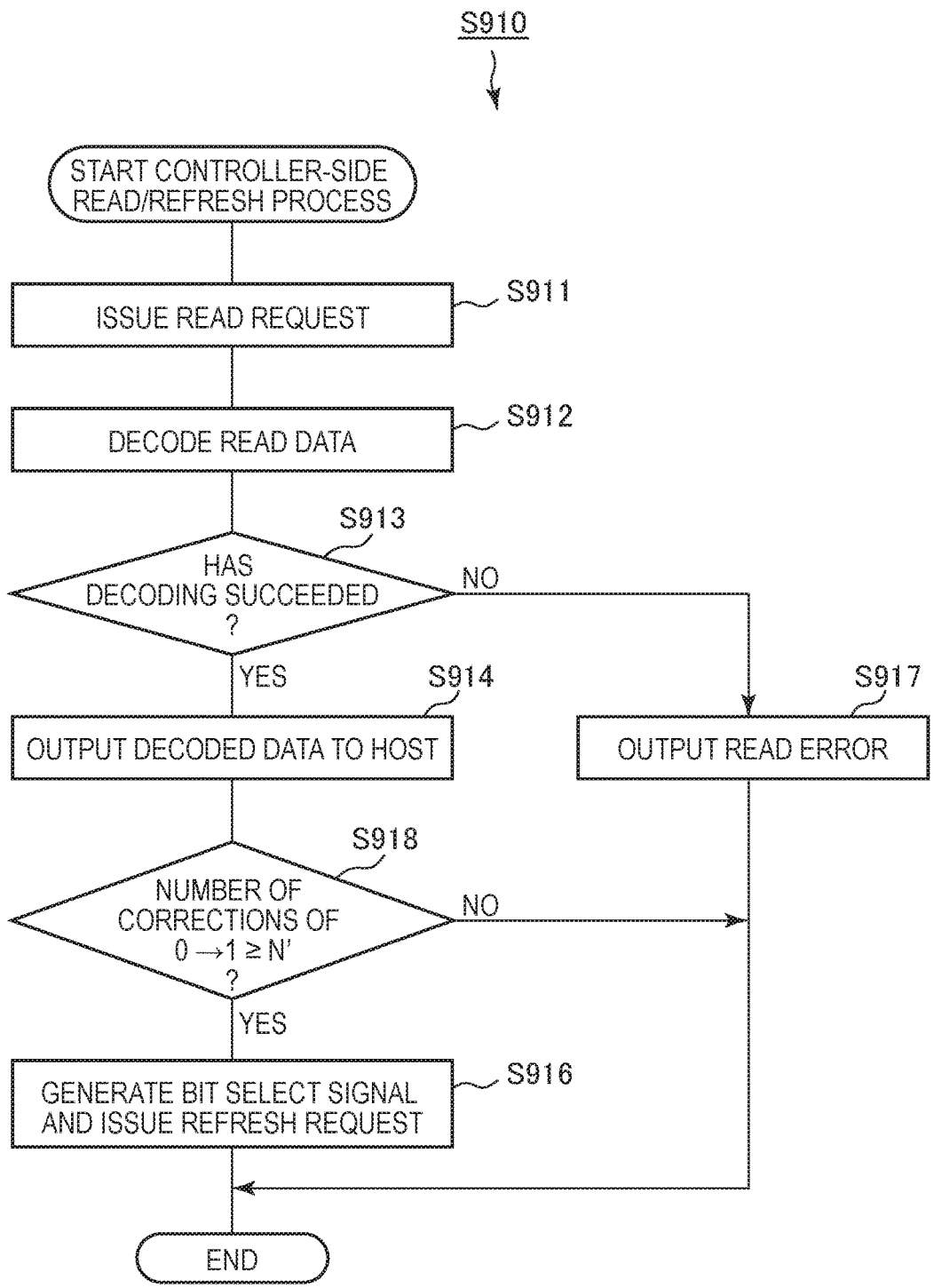
FIG. 23 is a flowchart illustrating an example of a controller-side read/refresh process according to a fourth embodiment.

FIG. 23 is a flowchart illustrating an example of a controller-side read/refresh process according to the fourth embodiment. The controller-side read/refresh process of the fourth embodiment differs from that of the first embodiment in that step S918 is performed instead of step S915.

After decoded data is output (step S914), the memory controller 300 determines whether or not the number of errors which have been corrected from "0" to "1" is equal to or greater than the allowable value N' (N': integer) (step S918). When the number of corrections is equal to or greater than N' (step S918: Yes), the memory controller 300 performs step S916. On the other hand, when the number of corrections is less than N' (step S918: No) or after step S917, the memory controller 300 terminates the controller-side read/refresh process.

According to the fourth embodiment of the present technology, the memory controller 300 performs a refresh when the number of errors having a predetermined pattern is equal to or greater than an allowable value as described above and therefore it is possible to refresh memory cells except those having errors in patterns other than the predetermined pattern. This suppresses unnecessary refreshes, thereby preventing degradation of memory cells.

<5. Fifth Embodiment>

Multivalued memory cells may also be provided as the non-volatile memory 400 although the first embodiment has been described above assuming that binary memory cells are provided as the non-volatile memory 400. A memory system of this fifth embodiment differs from that of the first embodiment in that the memory system includes multivalued memory cells as the non-volatile memory 400.

Figure 24:
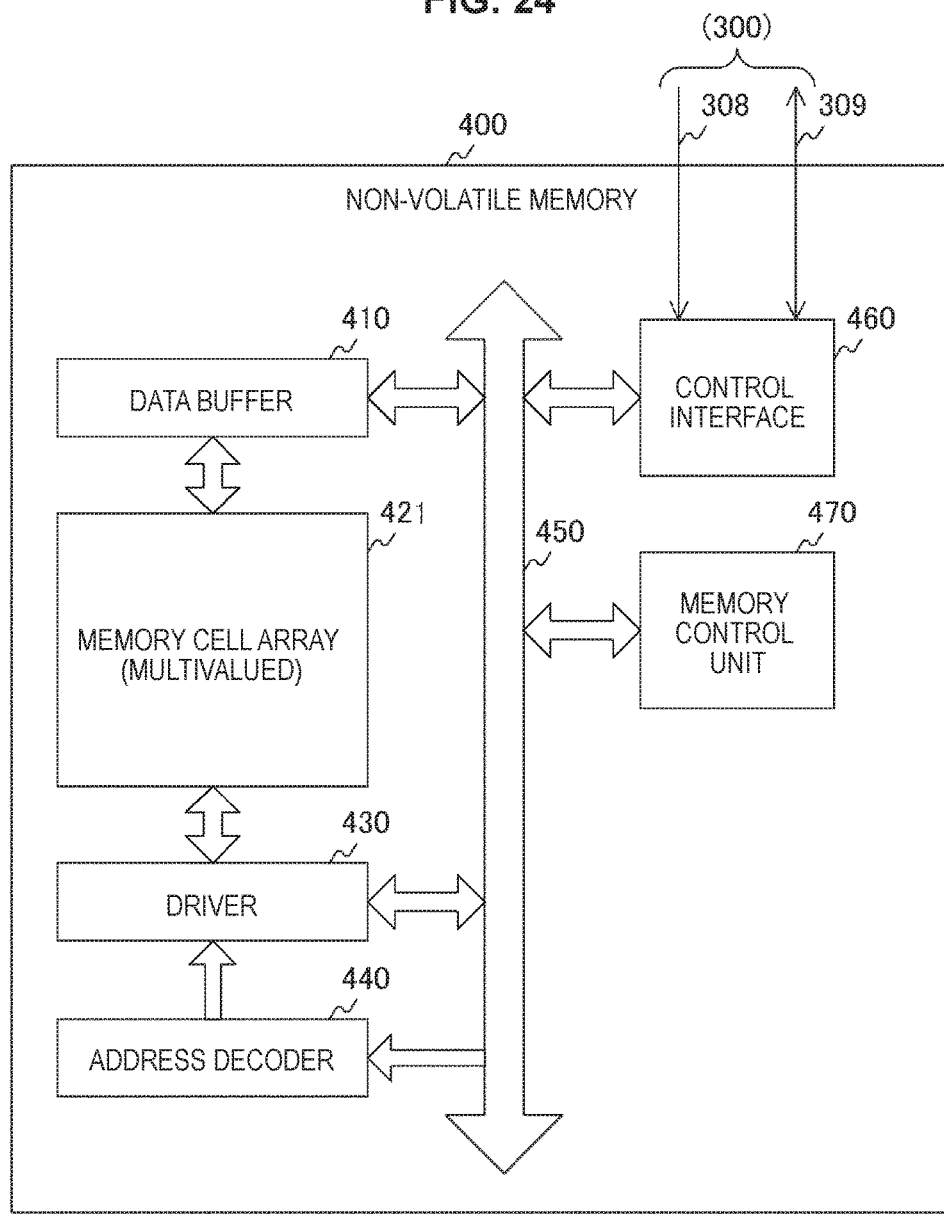
FIG. 24 is a block diagram illustrating an example of a configuration of a non-volatile memory according to a fifth embodiment.

FIG. 24 is a block diagram illustrating an example of a configuration of the non-volatile memory 400 according to the fifth embodiment. The non-volatile memory 400 of the fifth embodiment differs from that of the first embodiment in that the non-volatile memory 400 includes a memory cell array 421 instead of the memory cell array 420.

The memory cell array 421 differs from that of the first embodiment in that a plurality of multivalued memories is provided in a two-dimensional grid pattern. Each of the multivalued memory cells holds a plurality of bits.

Figure 25:
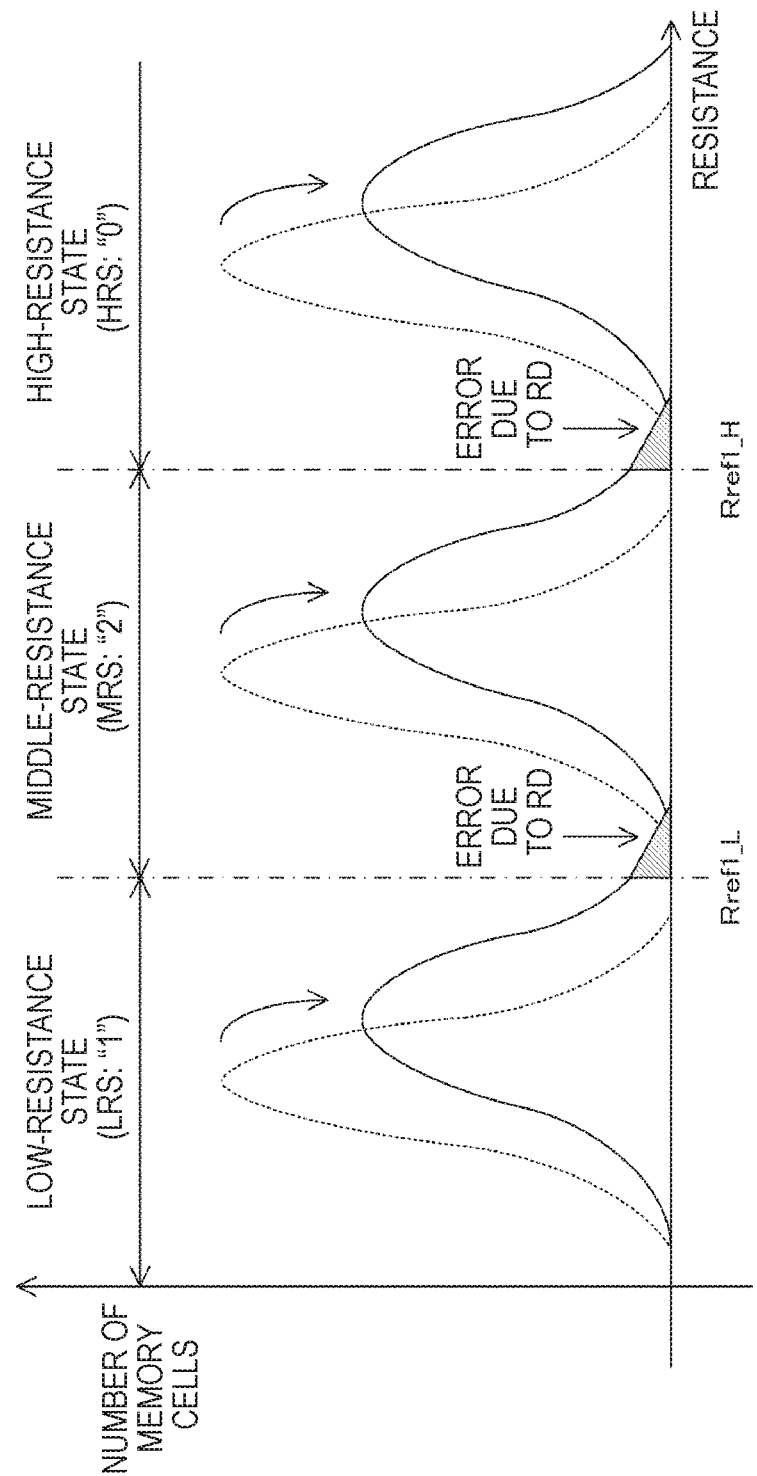
FIG. 25 is a view illustrating an example of a resistance distribution of memory cells after reading is repeated according to the fifth embodiment.

FIG. 25 is a view illustrating an example of a resistance distribution of memory cells after reading is repeated according to the fifth embodiment. In FIG. 25, the vertical axis represents the number of memory cells and the horizontal axis represents the resistance. The resistance distribution of multivalued memory cells of the ReRAM is divided at two thresholds (such as $R_{refl\_H}$ and $R_{refl\_L}$) into three parts. The three parts of the distribution are referred to as a low-resistance state (LRS), a middle-resistance state (MRS), and a high-resistance state (HRS). For example, a value of "1" is allocated to the LRS, a value of "2" is allocated to the MRS, and a value of "0" is allocated to the HRS.

In FIG. 25, dotted curves represent the states of memory cells immediately after rewriting and solid curves represent the states of memory cells that have changed due to repetition of reading by sense signals. As exemplified in FIG. 25, repetition of reading causes the resistance to deviate higher. This RD causes an RD error such that "2" corresponding to the MRS is read from a bit to which "1" has been written. Alternatively, the RD causes an RD error such that "0" corresponding to the HRS is read from a bit to which "2" has been written. Hashed parts in FIG. 25 represent portions where RD errors have occurred.

Figure 26A:
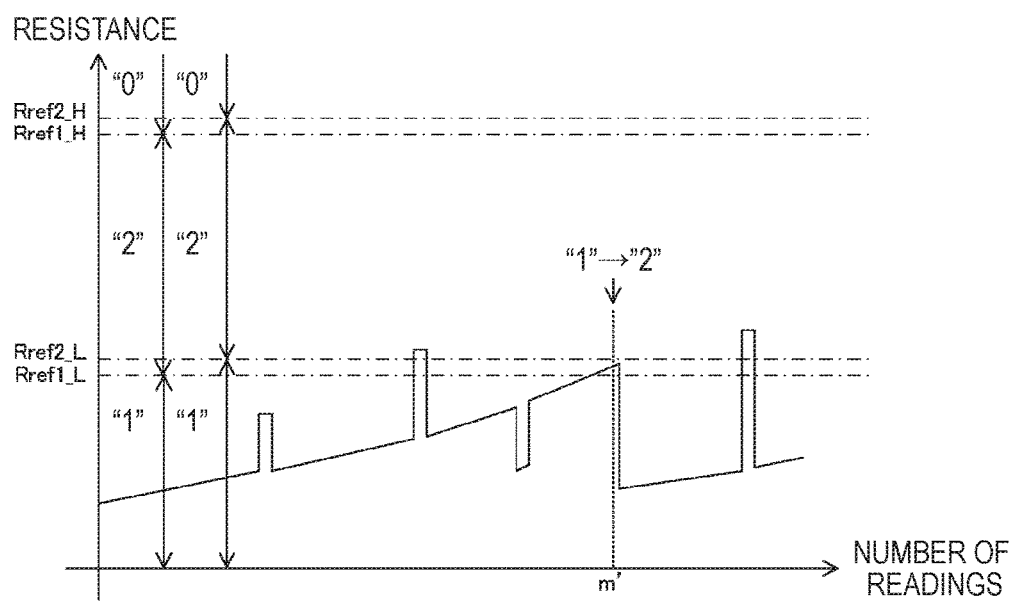
FIGS. 26a and 26b are views illustrating an example of a change of resistance as the number of readings increases according to the fifth embodiment.
Figure 26B:
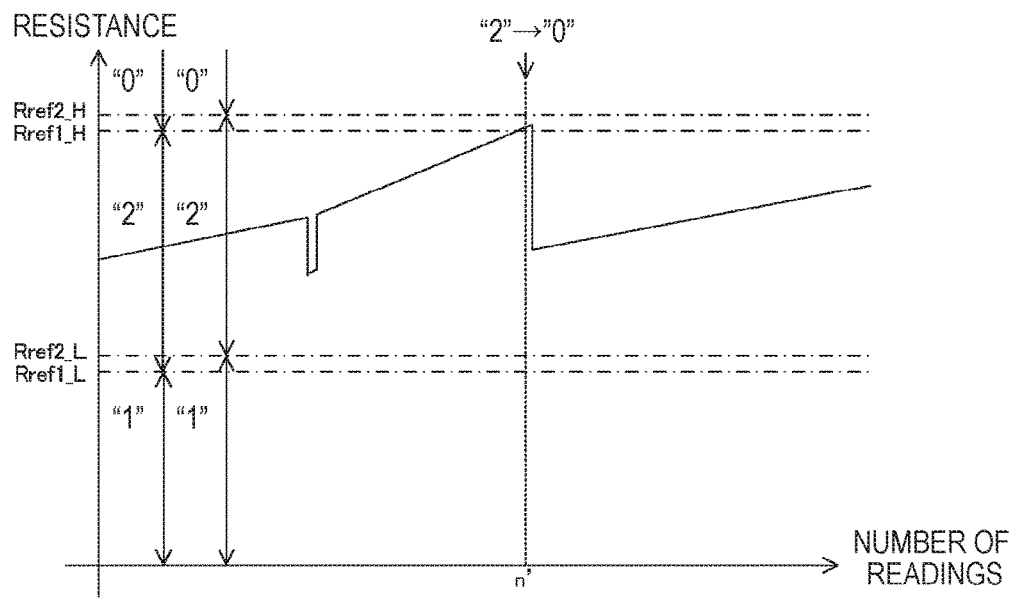

FIGS. 26a and 26b are views illustrating an example of a change of resistance as the number of readings increases according to the fifth embodiment. In FIGS. 26a and 26b, the vertical axis represents the resistance and the horizontal axis represents the number of readings. FIG. 26a is a diagram illustrating changes of the resistance of a memory cell to which "1" corresponding to the LRS has been written. At the first reading shown at the left end, the resistance is lower than the reference resistance Rref1_L and a value of "1" is normally read. Here, let us assume that the resistance has increased due to RD as reading is repeated such that the resistance has exceeded the reference resistance Rref1_L at the m'-th reading. As a result, an RD error occurs such that a value of "2" corresponding to the MRS is erroneously read.

Upon detecting an error from the m'-th read data, the memory controller 300 issues a refresh request and the non-volatile memory 400 changes the reference resistances to $R_{ref2}\_L$ and $R_{ref2}\_H$ and performs re-reading as an m'+1-th reading. When the error is an RD error, a correct logic value of "1" is read at the m'+1-th reading. In this case, the non-volatile memory 400 rewrites the memory cell with "1".

FIG. 26b is a diagram illustrating changes of the resistance of a memory cell to which "2" corresponding to the MRS has been written. At the first reading shown at the left end, the resistance is between the reference resistances Rref1_H and Rref1_L and a value of "2" is normally read. Here, let us assume that the resistance has increased due to RD as reading is repeated such that the resistance has exceeded the reference resistance Rref1_H at the n'-th reading. As a result, an RD error occurs such that a value of "0" corresponding to the HRS is erroneously read.

Upon detecting an error from the n'-th read data, the memory controller 300 issues a refresh request and the non-volatile memory 400 changes the reference resistances to $R_{ref2}\_L$ and $R_{ref2}\_H$ and performs re-reading as an n'+1-th reading. When the error is an RD error, a correct logic value of "2" is read at the n'+1-th reading. In this case, the non-volatile memory 400 rewrites the memory cell with "2".

According to the fifth embodiment of the present technology, the non-volatile memory 400 reads read data for each memory cell on the basis of a plurality of thresholds and changes the thresholds to read re-read data as described above and therefore it is possible to use multivalued memory cells as memory cells of the non-volatile memory 400.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described here are not necessarily limited, and any effect that is desired to be described in the present disclosure may be exhibited.

Additionally, the present technology may also be configured as below.

(1)

A memory system including:

a read processing unit configured to perform a read process for reading read data from each of a plurality of memory cells on the basis of a first threshold;

an error detection unit configured to detect presence or absence of an error in the read data and to specify memory cells in which the error is present among the plurality of memory cells;

a re-read processing unit configured to perform a re-read process for reading data, as re-read data, from the specified memory cells on the basis of a second threshold different from the first threshold; and a refresh processing unit configured to rewrite, for a memory cell of which the re-read data has a different value from the read data among the specified memory cells, data with the re-read data as a refresh process.

(2)

The memory system according to (1), further including:

a refresh control unit configured to allow the re-read unit to perform the re-read process for a memory cell, in which the error having a predetermined pattern has occurred, among the specified memory cells.

(3)

The memory system according to (2), further including:

an address holding unit configured to hold an address allocated to the memory cells in which the error is present, wherein, when a predetermined condition has been satisfied, the refresh control unit reads the held address, designates the address, and allows the read processing unit to perform the read process.

(4)

The memory system according to (2) or (3), wherein the predetermined condition is that the number of the held addresses exceed a predetermined number.

(5)

The memory system according to (2) or (3), wherein the predetermined condition is that the refresh control unit have received a refresh command instructing that the refresh process be performed.

(6)

The memory system according to (2), wherein the plurality of memory cells are divided into a plurality of sections, one of the plurality of addresses being allocated to each of the plurality of sections, and when a refresh mode for performing the refresh process has been set, the refresh control unit sequentially designates each of the plurality of addresses and allows the read processing unit to perform the read process.

(7)

The memory system according to any of (2) to (5), wherein, when the number of the errors having the predetermined pattern exceeds an allowable value, the refresh control unit allows the re-read unit to perform the re-read process for a memory cell, in which the error having the predetermined pattern has occurred, among the specified memory cells.

(8)

The memory system according to any of (1) to (7), wherein each of the plurality of memory cells holds data including a plurality of bits, and each of the first and second thresholds includes a plurality of thresholds.

(9)

The memory system according to any of (1) to (8), wherein a characteristic value of the memory cells changes in a specific direction each time data is read, and the second threshold is a value obtained by changing the first threshold in the specific direction.

(10)

A storage device including:

a plurality of memory cells;

a read processing unit configured to perform a read process for reading read data from each of the plurality of memory cells on the basis of a first threshold;

a re-read processing unit configured to perform a re-read process for reading data, as re-read data, from each of memory cells having an error in the read data on the basis of a second threshold different from the first threshold; and a refresh processing unit configured to rewrite, for a memory cell of which the re-read data has a different value from the read data among the memory cells which have an error in the read data, data with the re-read data as a refresh process.

(11)

A method for controlling a memory system, the method including:

a read processing process of allowing a read processing unit to perform a read process for reading read data from each of a plurality of memory cells on the basis of a first threshold;

an error detection process of allowing an error detection unit to detect presence or absence of an error in the read data and to specify memory cells in which the error is present among the specified memory cells;

a re-read processing process of allowing a re-read processing unit to perform a re-read process for reading data, as re-read data, from the specified memory cells on the basis of a second threshold different from the first threshold; and a refresh processing process of allowing a refresh processing unit to rewrite, for a memory cell of which the re-read data has a different value from the read data among the specified memory cells, data with the re-read data as a refresh process.

REFERENCE SIGNS LIST 100 host computer
200 storage
300 memory controller
301 host interface
302 RAM
303 CPU
304 ECC processing unit
305 ROM
306, 450 bus
307 memory interface
310 write control unit
320, 321 read control unit
330, 331, 332 refresh control unit
340 address register
400 non-volatile memory
410 data buffer
420, 421 memory cell array
430 driver
440 address decoder
460 control interface
470 memory control unit
471 request decoder
472 write processing unit
473 read processing unit
474 re-read processing unit
475 refresh processing unit

The invention claimed is:

1. A memory system, comprising:
a read processing unit configured to perform a read process, for reading read data from each of a plurality of memory cells, based on a first threshold;
an error detection unit configured to detect presence or absence of an error, from a number of errors, in the read data, and to specify memory cells in which the error is present among the plurality of memory cells;
a re-read processing unit configured to perform a re-read process for reading data, as re-read data, from the specified memory cells, based on a second threshold different from the first threshold; and
a refresh processing unit configured to rewrite, for a memory cell of which the re-read data has a different value from the read data among the specified memory cells, data with the re-read data as a refresh process.

2. The memory system according to claim 1, further comprising:
a refresh control unit configured to allow the re-read unit to perform the re-read process for a memory cell, in which the error having a predetermined pattern has occurred, among the specified memory cells.

3. The memory system according to claim 2, further comprising:
an address holding unit configured to hold a number of addresses allocated to the specified memory cells in which the error is present,
wherein, when a predetermined condition has been satisfied, the refresh control unit reads one of the number of the held addresses, designates the address, and allows the read processing unit to perform the read process.

4. The memory system according to claim 3, wherein the predetermined condition is that the number of the held addresses exceed a predetermined number.

5. The memory system according to claim 3, wherein the predetermined condition is that the refresh control unit have received a refresh command instructing that the refresh process be performed.

6. The memory system according to claim 2, wherein the plurality of memory cells are divided into a plurality of sections, one of a plurality of addresses being allocated to each of the plurality of sections, and
when a refresh mode for performing the refresh process has been set, the refresh control unit sequentially designates each of the plurality of addresses and allows the read processing unit to perform the read process.

7. The memory system according to claim 6, wherein, when the number of the errors having the predetermined pattern exceeds an allowable value, the refresh control unit allows the re-read unit to perform the re-read process for a memory cell, in which the error having the predetermined pattern has occurred, among the specified memory cells.

8. The memory system according to claim 1, wherein each of the plurality of memory cells holds data including a plurality of bits, and
    each of the first and second thresholds includes a plurality of thresholds.

9. The memory system according to claim 1, wherein
    a characteristic value of the specified memory cells changes in a specific direction each time data is read, and
    the second threshold is a value obtained by changing the first threshold in the specific direction.

10. A storage device, comprising:
    a plurality of memory cells;
    a read processing unit configured to perform a read process, for reading read data from each of the plurality of memory cells, based on a first threshold;
    a re-read processing unit configured to perform a re-read process, for reading data, as re-read data, from each of memory cells having an error in the read data, based on a second threshold different from the first threshold; and
    a refresh processing unit configured to rewrite, for a memory cell of which the re-read data has a different value from the read data among the memory cells which have an error in the read data, data with the re-read data as a refresh process.

11. A method for controlling a memory system, the method comprising:
    a read processing process of allowing a read processing unit to perform a read process, for reading read data from each of a plurality of memory cells, based on a first threshold;
    an error detection process of allowing an error detection unit to detect presence or absence of an error in the read data and to specify memory cells in which the error is present among the specified memory cells;
    a re-read processing process of allowing a re-read processing unit to perform a re-read process for reading data, as re-read data, from the specified memory cells, based on a second threshold different from the first threshold; and
    a refresh processing process of allowing a refresh processing unit to rewrite, for a memory cell of which the re-read data has a different value from the read data among the specified memory cells, data with the re-read data as a refresh process.

* * * * *